US006772111B2

(12) United States Patent
Araki

(10) Patent No.: US 6,772,111 B2
(45) Date of Patent: Aug. 3, 2004

(54) DIGITAL AUDIO CODING APPARATUS, METHOD AND COMPUTER READABLE MEDIUM

(75) Inventor: Tadashi Araki, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 630 days.

(21) Appl. No.: 09/865,496

(22) Filed: May 29, 2001

(65) Prior Publication Data

US 2002/0022898 A1 Feb. 21, 2002

(30) Foreign Application Priority Data

May 30, 2000 (JP) ....................................... 2000-160999

(51) Int. Cl.[7] ........................... G10L 19/00; H03M 7/30

(52) U.S. Cl. ..................... 704/200.1; 704/229; 704/500

(58) Field of Search .............................. 704/200.1, 229, 704/500

(56) References Cited

U.S. PATENT DOCUMENTS 5,627,938 A * 5/1997 Johnston .................. 704/200.1
6,456,963 B1 * 9/2002 Araki ...................... 704/200.1

FOREIGN PATENT DOCUMENTS

| | | |
|---|---|---|
| JP | 5-248972 | 9/1983 |
| JP | 7-46137 | 2/1995 |
| JP | 9-101799 | 4/1997 |

* cited by examiner

*Primary Examiner*—Susan McFadden
(74) *Attorney, Agent, or Firm*—Oblon, Spivak, McClelland, Maier & Neustadt, P.C.

(57) ABSTRACT

A digital audio coding apparatus includes a part which converts a frame of digital audio data into a frequency domain; a part which divides the digital audio data into a plurality of bands; a part which calculates an allowed distortion level by using an absolute hearing threshold for each divided band and assigns coding bits; a change part which changes the absolute hearing threshold adaptively on the basis of intensity distribution of the digital audio data in the frequency domain.

18 Claims, 23 Drawing Sheets

FIG.17

| AREA BETWEEN CURVE AND LINE | SETTING OF ABSOLUTE HEARING THRESHOLD |
|---|---|
| 700≦ | RECOMMENDATION TABLE VALUE +20dB |
| 600-700 | RECOMMENDATION TABLE VALUE +10dB |
| 500-600 | RECOMMENDATION TABLE VALUE |
| 400-500 | RECOMMENDATION TABLE VALUE -10dB |
| <400 | RECOMMENDATION TABLE VALUE -20dB |

FIG.21

| SHORT BLOCK i | AREA BETWEEN CURVE AND LINE Si |
|---|---|
| 0 | 78 |
| 1 | 73 |
| 2 | 108 |
| 3 | 126 |
| 4 | 112 |
| 5 | 124 |
| 6 | 87 |
| 7 | 78 |
| SUM $S = \sum_i S_i$ | 786 |

FIG.22

| SUM OF AREAS BETWEEN CURVE AND LINE $S = \sum_i Si$ | SETTING OF ABSOLUTE HEARING THRESHOLD |
|---|---|
| 700≦ | RECOMMENDATION TABLE VALUE +20dB |
| 600-700 | RECOMMENDATION TABLE VALUE +10dB |
| 500-600 | RECOMMENDATION TABLE VALUE |
| 400-500 | RECOMMENDATION TABLE VALUE -10dB |
| <400 | RECOMMENDATION TABLE VALUE -20dB |

DIGITAL AUDIO CODING APPARATUS, METHOD AND COMPUTER READABLE MEDIUM

BACKGROUND OF THE INVENTION

1. Field of the Invention

The present invention relates to a digital audio coding method, a digital audio coding apparatus and a recording medium. More particularly, the present invention relates to a compression and coding technique of a digital audio signal used for DVD, digital broadcast and the like.

2. Description of the Related Art

As previously known, human psychoacoustic characteristics are utilized in the technique of high quality compression and coding of a digital audio signal. One of the characteristics is that small sound is masked by large sound so that small sound can not be heard. That is, when large sound having a frequency occurs, small sound near the frequency is masked so that it can not be heard. The lower limit intensity of the sound in which the sound is masked and can not be heard is called a masking threshold.

As for the human ear, the sensitivity becomes the highest for sound around 4 kHz irrespective of the masking. As the frequency band becomes more apart from 4 kHz, the sensitivity becomes worse. This characteristic can be represented as a lower limit intensity which the human ear can perceive in a silent situation. This lower limit intensity is called an absolute hearing threshold.

The characteristics will be described more particularly with reference to FIG. 1. Intensity of audio signal is represented by the thick solid line. The masking threshold for the audio signal is represented by the dotted line. The thin solid line represents the absolute hearing threshold. That is, the human ear can perceive a sound only when the intensity is larger than the values represented by the dotted line and the thin solid line. Therefore, if information which is larger than the dotted line and the thin solid line is extracted from information represented by the thick solid line, the human ear perceives the extracted information to be the same as the original audio signal.

When performing coding, this is equivalent to assigning coding bits only to parts indicated by shaded regions in FIG. 1. When assigning coding bits in this example, the whole frequency band of the audio signal is divided into a plurality of small bands so that coding bits are assigned to each divided band. The width of each shaded area corresponds to the divided bandwidth.

In each divided bandwidth, the human ear can not perceive a sound of intensity equal to or smaller than the lower limit of the shaded area. Thus, if the intensity difference between original sound and coded/decoded sound does not exceed this lower limit, the sound can not be heard. In this sense, the intensity of the lower limit is called an allowed distortion level. When an audio signal is compressed by performing quantization, the audio signal can be compressed without loss of quality of the original sound by performing quantization such that quantization distortion level of coded/decoded sound with respect to the original sound becomes equal to or smaller than the allowed distortion level.

Accordingly, assigning coding bits only to the shaded regions shown in FIG. 1 corresponds to performing quantization such that quantization distortion level in each divided band becomes just the allowed distortion level.

There are MPEG Audio, Dolby Digital and the like as coding methods of a audio signal. Each of the methods uses the property described above. In the methods, MPEG-2 Audio AAC (Advanced Audio Coding) standardized in ISO/IEC13818-7 is regarded as being most efficient for coding.

FIG. 2 shows a basic block diagram of a coding apparatus for AAC. The psychoacoustic model part 1 calculates the allowed distortion level for each divided band of an input audio signal which is divided into frames along time base.

For the input audio signal which is divided into frames, a gain control part 2 performs gain control, a filter bank 3 converts the input audio signal to the frequency domain by MDCT (Modified Discrete Cosine Transform), a TNS 4 performs a temporal noise shaping process, an intensity/coupling stereo part 5 performs intensity/coupling, a prediction part 6 performs a predictive coding process, an M/S stereo part 7 performs a middle side stereo process. After that, a part 8 determines normalized coefficients, and a quantization part 9 quantizes the audio signal based on the normalized coefficients. The normalized coefficients correspond to the allowed distortion level shown in FIG. 1 which is determined for each divided band.

After quantization, a noiseless coding part 10 performs a noiseless coding process by providing each of the normalized coefficient and the quantized value with Huffman code based on a predetermined Huffman code table. Finally, a code bit stream is formed by a multiplexor 11.

According to the MDCT in the filter bank 3, as shown in FIG. 3, DCT is performed in which each transform region overlaps with another transform region by 50% with respect to time axis. Accordingly, occurrence of distortion in boundary parts can be suppressed for each transform region. The number of MDCT coefficients is half of the number of samples of the transform region. According to AAC, a long transform region (long block) including 2048 samples or eight short transform regions including 256 samples in each transform region (short block) is applied for an input audio signal frame. Thus, the number of MDCT coefficients is 1024 for the long block and 128 for the short block. As for the short block, eight blocks are always used successively so that the number of the MDCT coefficients becomes the same as that of the long block.

Generally, as shown in FIG. 4, the long block is used for a steady-state part where variation of a signal waveform is small. As shown in FIG. 5, the short block is used for an attack part where variation of a signal waveform is large.

It is important to use the long block or the short block appropriately. When the long block is used for a signal like that shown in FIG. 5, noise which is called pre-echo occurs before attack. In addition, when the short block is used for a part shown in FIG. 4, bit assignment is not properly performed due to lack of resolution in the frequency domain so that coding efficiency decreases and noise also occurs.

As mentioned above, it is important to calculate the allowed distortion level for each divided band and to determine the long block or the short block properly. The psychoacoustic model part 1 shown in FIG. 2 performs these processes. In the ISO/IEC13818-7, examples of a calculation method of the allowed distortion level for each divided band and a method of determining the long block or the short block for each current frame are shown. In the following, an outline of processes of the methods will be described. B.2.1.4 (p.93) in the ISO/IEC13838-7 can be referred to about details of these processes.

Step 1) Reconstruction of Audio Signal 1024 samples (128 samples for the short block) are newly read for the long block and a signal series of 2048 samples (258 samples) is reconstructed by concatenating the newly read samples and samples already read from a previous frame.

Step 2) Windowing by a Hann Window and FFT

The audio signal of 2048 samples (256 samples) reconstructed in step 1 is windowed by a Hann window and FFT (Fast Fourier Transform) is calculated so that 1024 (128) FFT coefficients are calculated.

Step 3) Calculation of Predicted Values of FFT Coefficients

Real parts and imaginary parts of FFT coefficients of a current frame are predicted from real parts and imaginary parts of FFT coefficients of previous two frames so that 1024 (128) predicted values are calculated for each of the real part and imaginary part.

Step 4) Calculation of an Unpredictability Measure

The unpredictability measure is calculated from the real part and the imaginary part of each FFT coefficient calculated in step 2 and predicted values of the real part and the imaginary part of each FFT coefficient calculated in step 3. The unpredictability measure takes from 0 to 1. The nearer to 0 the unpredictability measure is, the nearer to a simple tone the audio signal is. In addition, the nearer to 1 the unpredictability measure is, the nearer to noise the audio signal is.

Step 5) Calculation of Intensity and Unpredictability of the Audio Signal for Each Divided Band The divided band here corresponds to that shown in FIG. 1. The intensity of the audio signal is calculated for each divided band based on each FFT coefficient calculated in step 2. In addition, the unpredictability calculated in step 4 is weighted by the intensity so that weighted unpredictability is calculated for each divided band.

Step 6) Convolution of the Intensity and the Unpredictability with a Spreading Function For each divided band, effect to the audio signal intensity and the unpredictability by other divided bands is calculated by the spreading function and each of the audio signal intensity and the unpredictability is convoluted and normalized.

Step 7) Calculation of Tonality Index

In each divided band b, the tonality index (tb(b)) is calculated by the following equation (1) based on the convoluted unpredictability (cb(b)) calculated in step 6.

$$tb(b)=-0.299-0.43\log_e(cb(b)) \tag{1}$$

In addition, the tonality index is limited to a range from 0 to 1. The nearer to 1 the tonality index is, the nearer to a simple tone the audio signal is. In addition, the nearer to 0 the tonality index is, the nearer to noise the audio signal is.

Step 8) Calculation of SNR

In each divided band, SNR is calculated based on the tonality index calculated in step 7. In the calculation, a property that masking effect of noise component is larger than that of simple tone component is utilized.

Step 9) Calculation of Intensity Ratio

In each divided band, the ratio between the convoluted audio signal and the masking threshold is calculated based on the SNR calculated in step 8.

Step 10) Calculation of Masking Threshold

In each divided band, the masking threshold is calculated based on the convoluted audio signal intensity calculated in step 6 and the ratio between the audio signal intensity and the masking threshold calculated in step 9.

Step 11) Pre-echo Control and Consideration of Absolute Hearing Threshold

In each divided band, pre-echo control is performed on the masking threshold calculated in step 10 by using the allowed distortion level of a previous block. In addition, a larger value between the controlled value and the absolute hearing threshold is set to be the allowed distortion level of the current frame.

Step 12) Calculation of Perceptual Entropy (PE)

For each of the long block and the short block, the perceptual entropy which is defined by the following equation (2) is calculated, $$PE=-\sum_b w(b)\cdot\log_{10}\frac{nb(b)}{e(b)+1} \tag{2}$$

wherein W(b) is width of the divided band b, nb(b) is the allowed distortion level in the divided band b calculated in step 11, e(b) is the audio signal intensity of the divided band b calculated in step 5. PE corresponds to total area of the bit assigned regions (diagonally shaded regions) shown in FIG. 1.

Step 13) Determining Whether the Long Block or the Short Block is Used

When the PE for the long block calculated in step 12 is larger than a predetermined constant (switch_pe), the current frame is judged to be the short block. When the PE is smaller than the constant, the current frame is judged to be the long block. The predetermined constant (switch_pe) is a value which is determined according to an application.

The above-mentioned methods are methods of calculation of the allowed distortion level and determining long block or short block described in the ISO/IEC13818-7.

In the above-mentioned determining method, the absolute hearing threshold is used in step 11 in which, in each divided band, a larger value between the pre-echo controlled masking threshold and the absolute hearing threshold is set as the allowed distortion level of the divided band. Then, in a divided band where the intensity of original sound is smaller than the absolute hearing threshold, it is regarded that the original sound can not be listened so that coding bits are not assigned at all or only a few coding bits are assigned in the band.

In principle, the absolute hearing threshold should be constant, that is, it should not vary according to input sound. In the ISO/IEC13818-7, it is recommended that a predetermined table value is used as the absolute hearing threshold.

However, when the allowed distortion level is obtained according to the above-mentioned processes by using a fixed absolute hearing threshold and bit assignment and coding are performed based on the fixed allowed distortion level, there are cases where satisfactory sound quality can not be obtained. For example, for a sound of a female voice vocal song which has frequency distribution of FIG. 6, good sound quality can be obtained by an absolute hearing threshold shown in the FIG. 6. However, when this absolute hearing threshold is applied to an orchestra sound shown in FIG. 7, grating noise is heard. The reason is that, although sound near 10 kHz–15 kHz is important for the orchestra sound, when the absolute hearing threshold shown in FIG. 7 is used, it is judged that sound near 10 kHz–15 kHz is lower than the absolute hearing threshold so that adequate bits are not assigned. When the absolute hearing threshold is lowered as a whole as shown in FIG. 8, the sound quality improves since the sound near 10 kHz–15 kHz becomes larger than the absolute hearing threshold so that adequate bits are assigned.

However, when the absolute hearing threshold of FIG. 8 is applied to the female voice vocal sound of FIG. 6 as shown in FIG. 9, the sound quality deteriorates. The reason is that, although sound of frequencies smaller than 10 kHz is important for the female voice vocal sound, bits are also assigned to sound near 12 kHz–15 kHz so that the number of bits which are assigned to frequencies under 10 kHz becomes relatively small.

Thus, according to the conventional method where the absolute hearing threshold is fixed, there is a problem in that adequately good sound quality is not necessarily obtained.

In addition, several methods of coding audio signals by using masking effect based on the psychoacoustic model are proposed, for example, in Japanese laid-open patent applications No.5-248972, No.7-46137 and No.9-101799. However, setting methods of the absolute hearing threshold are not proposed in any publication.

SUMMARY OF THE INVENTION

It is an object of the present invention to provide a digital audio coding apparatus, a digital audio coding method and a recording medium for improving sound quality by varying the absolute hearing threshold according to input audio data.

The above object of the present invention is achieved by a digital audio coding apparatus comprising:

- a part which converts a frame of digital audio data into a frequency domain;
- a part which divides the digital audio data into a plurality of bands;
- a part which calculates an allowed distortion level by using an absolute hearing threshold for each divided band and assigns coding bits;
- a change part which changes the absolute hearing threshold adaptively on the basis of intensity distribution of the digital audio data in the frequency domain.

The above object of the present invention is also achieved by a digital audio coding apparatus comprising:

- a part which divides input digital audio data into frames along a time axis;
- a part which performs processes including sub-band division and conversion into a frequency domain on each frame;
- a part which divides the digital audio data into a plurality of bands and assigns coding bits to each band;
- a part which obtains normalized coefficients according to the number of coding bits and encodes the digital audio data by quantizing with the normalized coefficients;
- a change part which changes an absolute hearing threshold adaptively on the basis of intensity distribution of the digital audio data in the frequency domain; and
- a part which calculates an allowed distortion level for each band by using the absolute hearing threshold and assigns the coding bits by using the allowed distortion level.

According to the above-mentioned invention, since the absolute hearing threshold is changed adaptively, the problems of the conventional technique can be solved so that sound quality is improved.

In the above-mentioned digital audio coding apparatus, the change part may change the absolute hearing threshold on the basis of logarithmic values of intensity of the digital audio data for each frame in the frequency domain.

Accordingly, the absolute hearing threshold can be properly changed.

In the above-mentioned digital audio coding apparatus, a straight line may be placed on a graph representing logarithmic values of intensity of the digital audio data in the frequency domain and the absolute hearing threshold may be set according to an area of a part between a curve representing the logarithmic values of intensity and the straight line.

In the above-mentioned digital audio coding apparatus, the change part may set the absolute hearing threshold to be high when the area of the part between the curve representing the logarithmic values of intensity and the straight line is larger than a predetermined value, and set the absolute hearing threshold to be low when the area is smaller than the predetermined value.

According to the above-mentioned invention, the absolute hearing threshold can be set properly according to input audio data so that sound quality is improved.

In the above-mentioned digital audio coding apparatus, an inclination of the straight line and a frequency range over which the area is calculated may be predetermined, and an initial point of the straight line may be set according to input digital audio data.

Accordingly, the absolute hearing threshold can be set easily.

In the above-mentioned digital audio coding apparatus, a maximum value among initial several points in the curve on a low frequency side in a frequency range over which the area is calculated may be set to be a value of the straight line for the lowest frequency in the frequency range.

According to the above-mentioned invention, the straight line can be placed properly.

In the above-mentioned digital audio coding apparatus, the change part may divide the frame into a plurality of small blocks and calculate the area for each of the small blocks.

In the above-mentioned digital audio coding apparatus, the change part may calculate a sum of areas of the small blocks, and set the absolute hearing threshold to be high when the sum is larger than a predetermined value, and set the absolute hearing threshold to be low when the sum is smaller than the predetermined value.

The above object of the present invention is also achieved by a digital audio coding apparatus comprising:

- a part which divides digital audio data into frames;
- a part which converts each frame of the digital audio data to a frequency domain by using a long transform block or a plurality of short transform blocks;
- a part which divides the frame of the digital audio data in the frequency domain into a plurality of bands;
- a part which calculates an allowed distortion level by using an absolute hearing threshold for each divided band and assigns coding bits; wherein:
- when the long transform block is used for conversion,
  - the frame is divided into a plurality of small blocks and each of the small blocks are converted to the frequency domain;
  - for each of the small blocks, a straight line is placed on a graph representing logarithmic values of intensity of the digital audio data in the frequency domain and an area of a part between a curve representing the logarithmic values of intensity and the straight line is calculated;
  - a sum of the areas of the small blocks are calculated, and, the absolute hearing threshold is set to be high when the sum is larger than a predetermined value, and the absolute hearing threshold is set to be low when the sum is smaller than the predetermined value; and
  - when the short transform blocks are used for conversion, a predetermined fixed absolute hearing threshold is used.

According to the above-mentioned invention, the absolute hearing threshold is changed adaptively so that sound quality is improved when the digital audio coding apparatus which converts audio data by using a long transform block or a plurality of short transform blocks is used.

BRIEF DESCRIPTION OF THE DRAWINGS

Other objects, features and advantages of the present invention will become more apparent from the following detailed description when read in conjunction with the accompanying drawings, in which:

FIG. 17 shows setting values of the absolute hearing threshold according to the area of the part;

FIG. 21 shows each area for each short block and the sum of the areas;

FIG. 22 shows setting values of the absolute hearing threshold according to the sum of the areas;

DETAILED DESCRIPTION OF THE PREFERRED EMBODIMENTS

Figure 1:
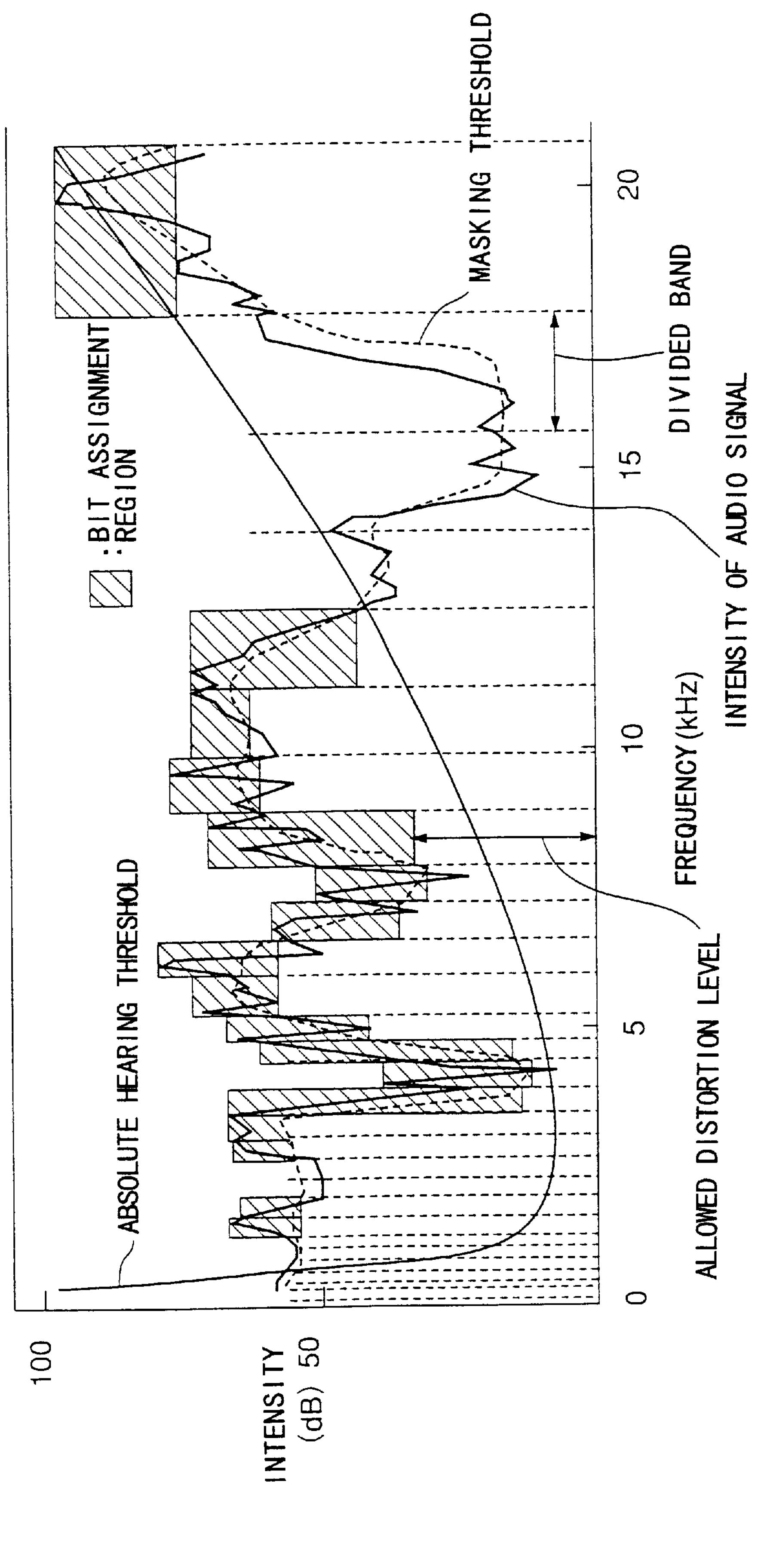
FIG. 1 PRIOR ART
FIG. 1 shows intensity distribution of an audio signal, a masking threshold and an absolute hearing threshold.
Figure 2:
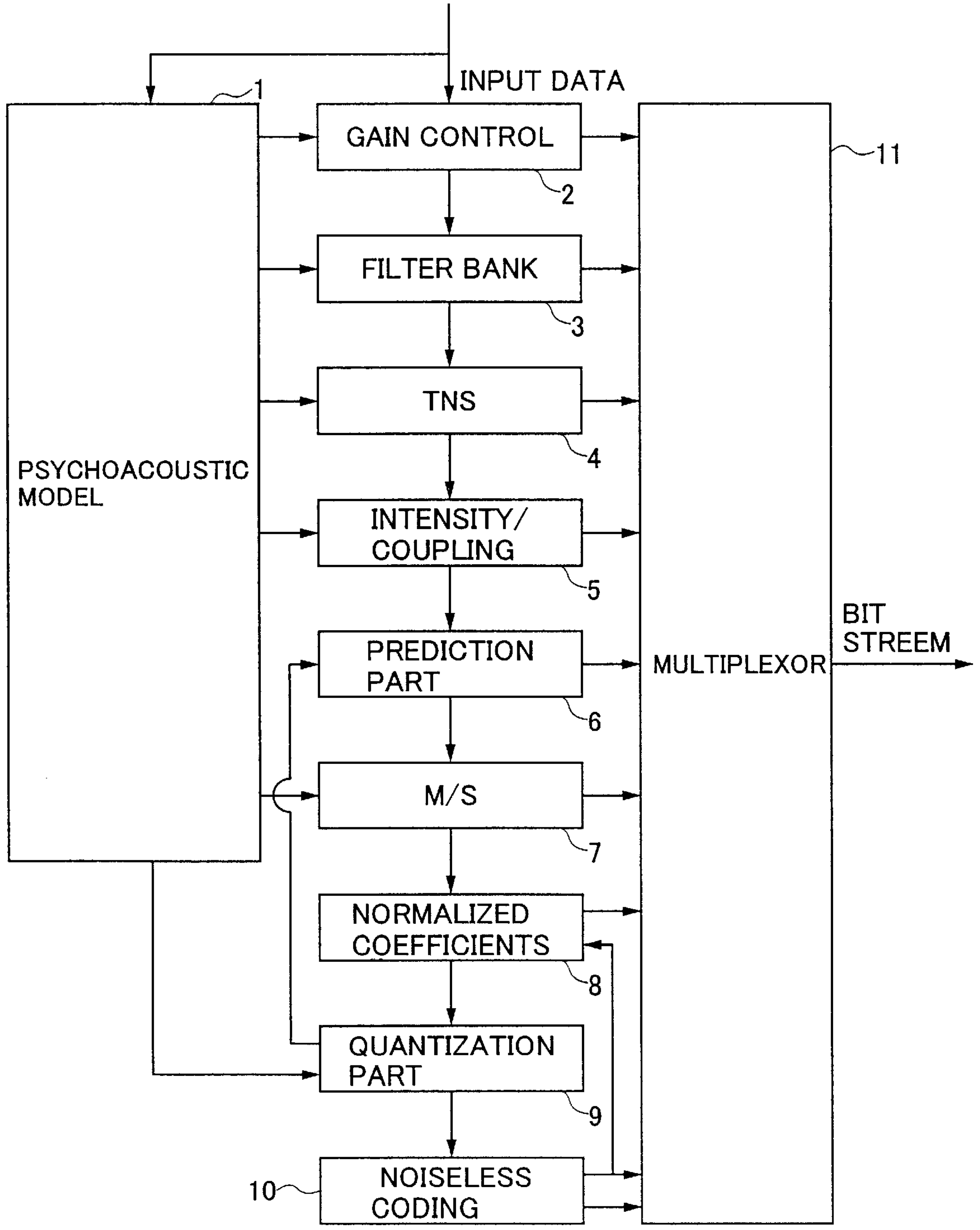
FIG.2 PRIOR ART
FIG. 2 shows a basic block diagram of a coding apparatus for AAC.
Figure 3:
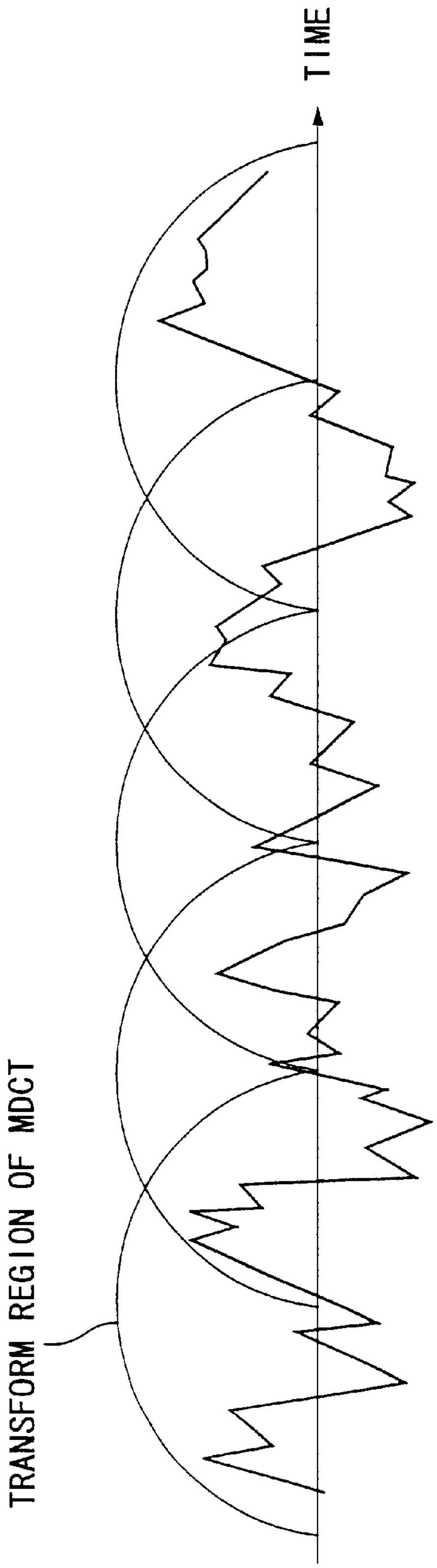
FIG. 3 PRIOR ART
FIG. 3 shows transform regions for MDCT.
Figure 4:
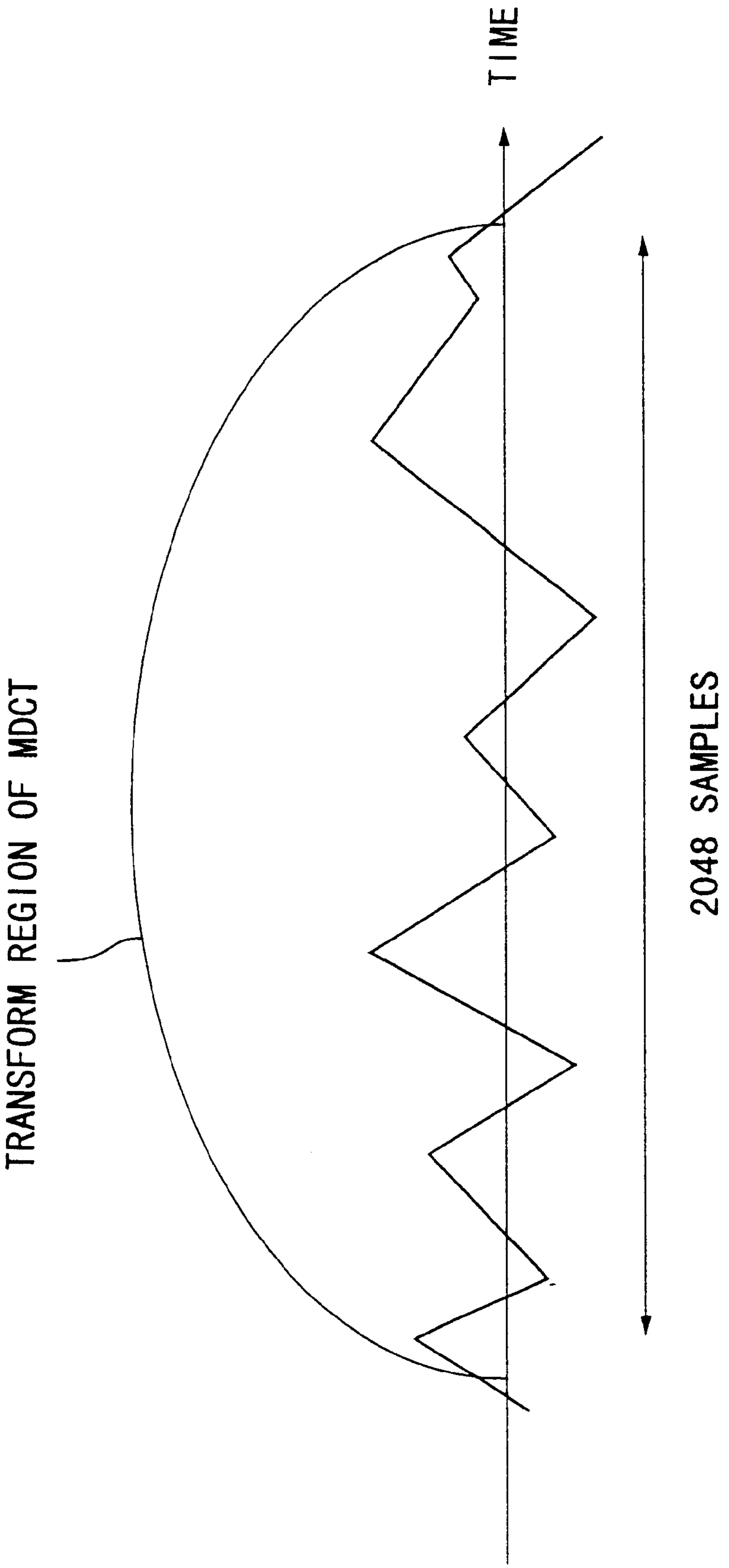
FIG. 4 PRIOR ART
FIG. 4 shows a transform region for MDCT in which variation of a signal waveform is small.
Figure 5:
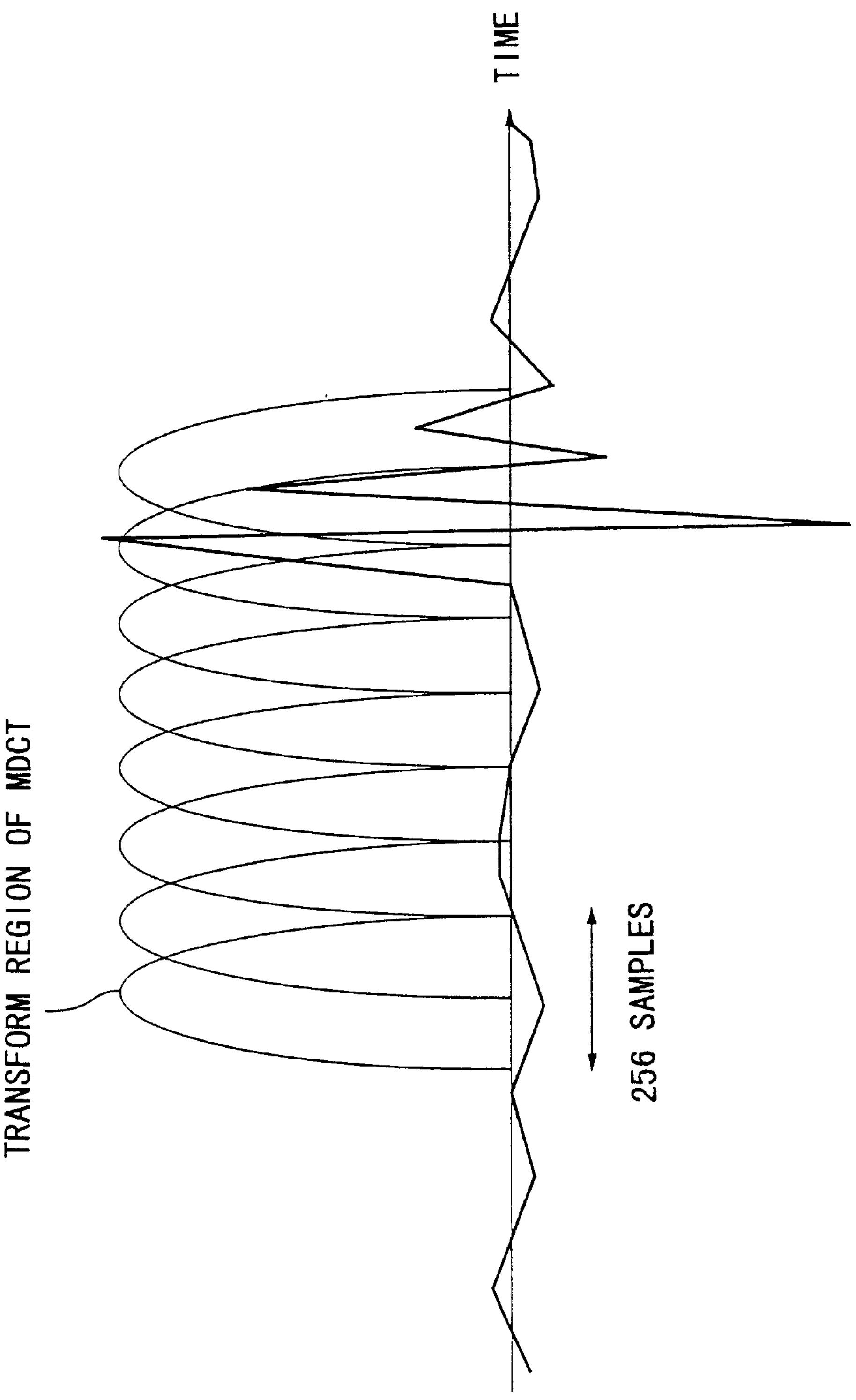
FIG. 5 PRIOR ART
FIG. 5 shows transform regions for MDCT in which variation of a signal waveform is large.
Figure 6:
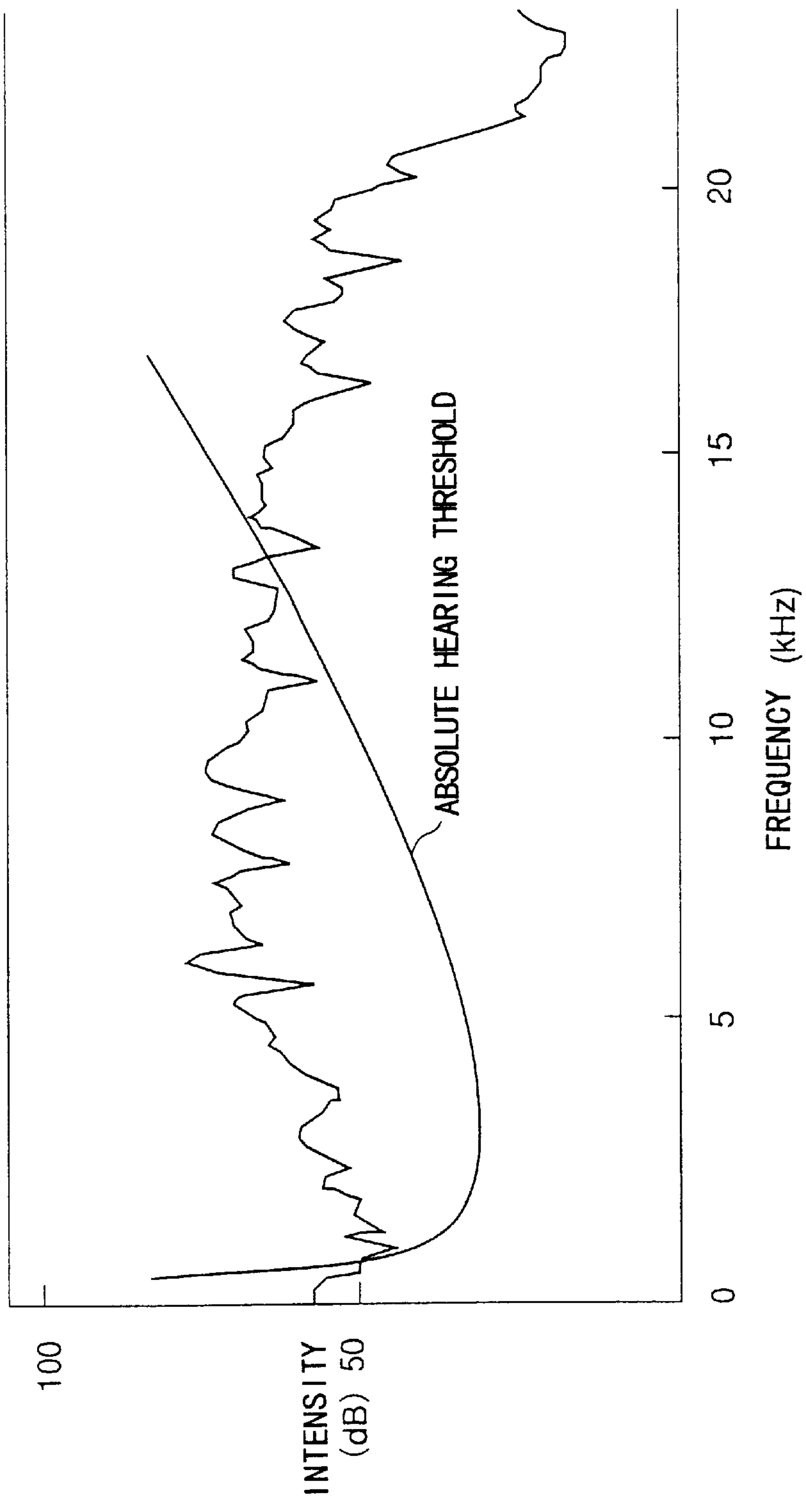
FIG. 6 PRIOR ART
FIG. 6 shows intensity distribution in the frequency domain for a sound of a female voice vocal song.
Figure 7:
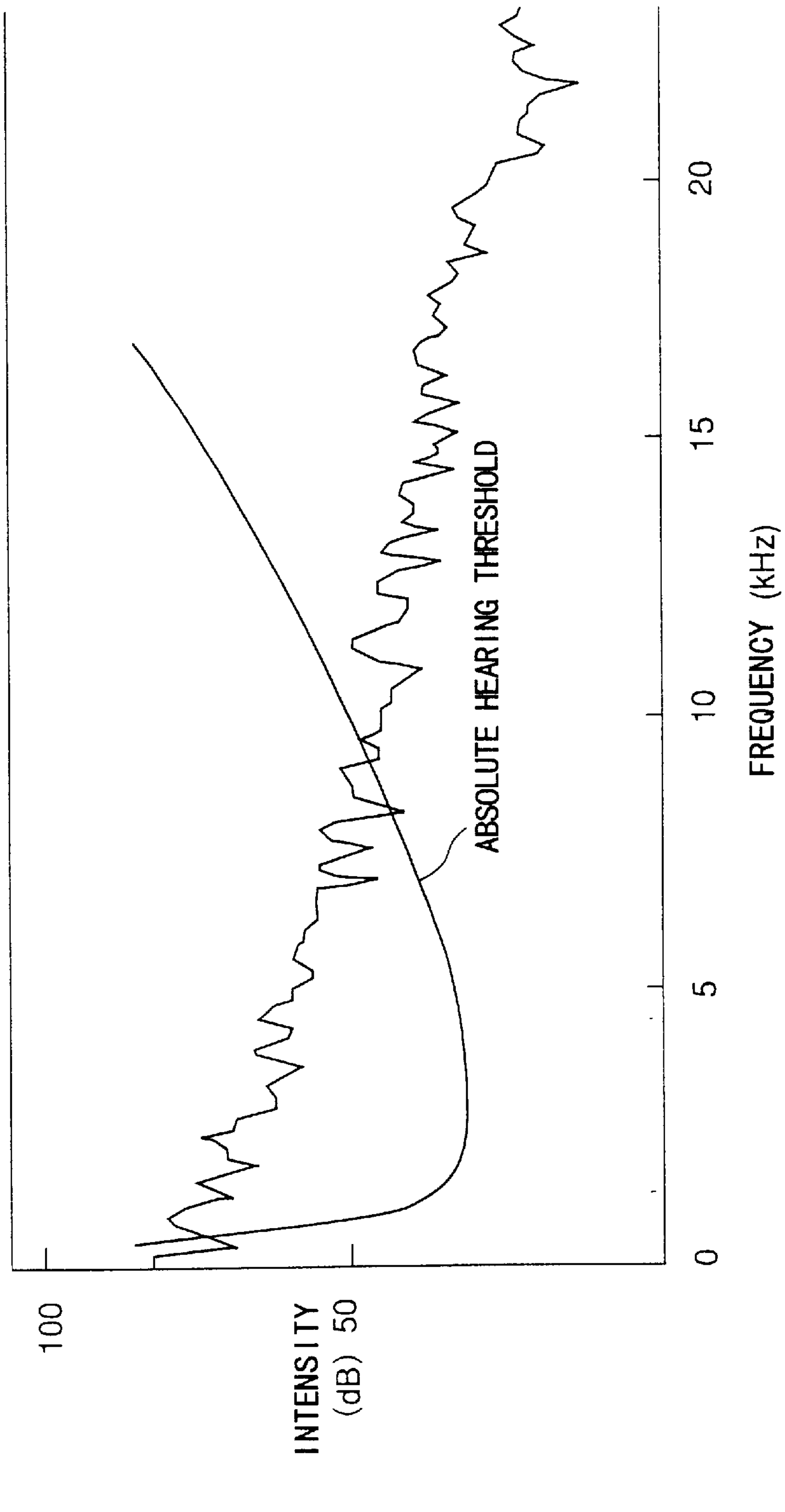
FIG. 7 PRIOR ART
FIG. 7 shows intensity distribution in the frequency domain for an orchestra sound.
Figure 8:
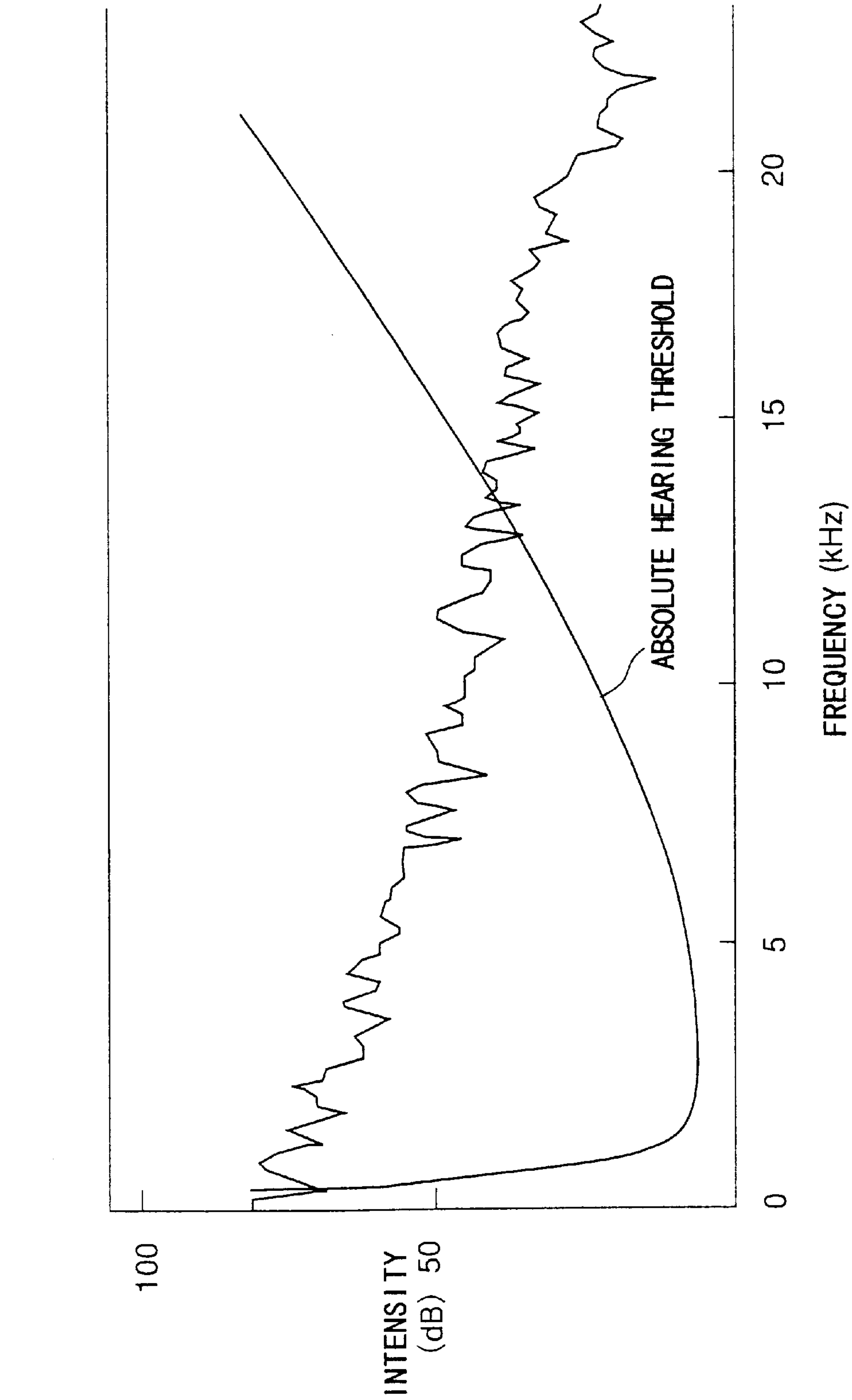
FIG. 8 PRIOR ART
FIG. 8 is a figure for explaining a case when the absolute hearing threshold is lowered for the orchestra sound.
Figure 9:
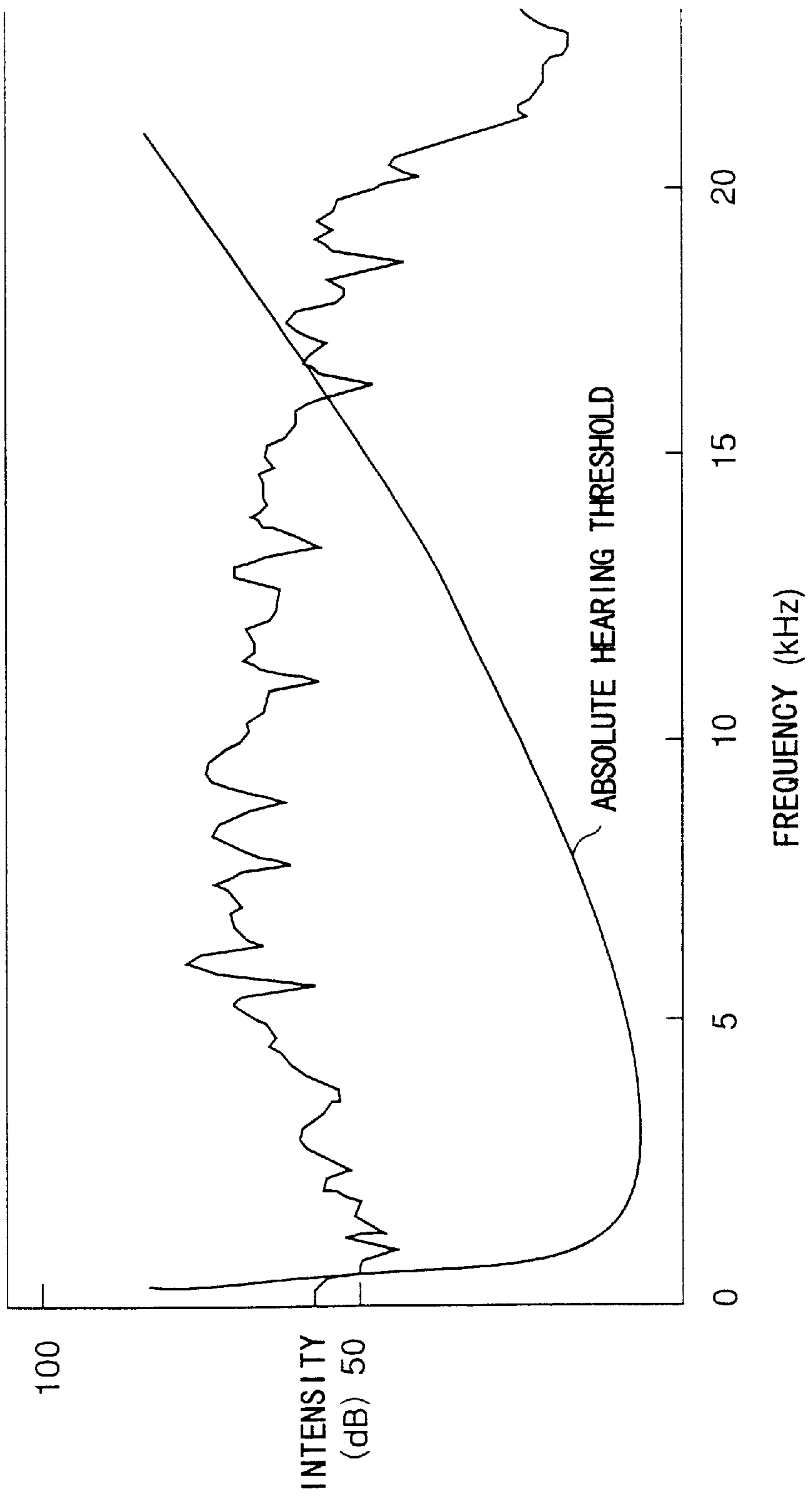
FIG. 9 PRIOR ART
FIG. 9 is a figure for explaining a case when the absolute hearing threshold is lowered for the sound of a female voice vocal song.
Figure 10:
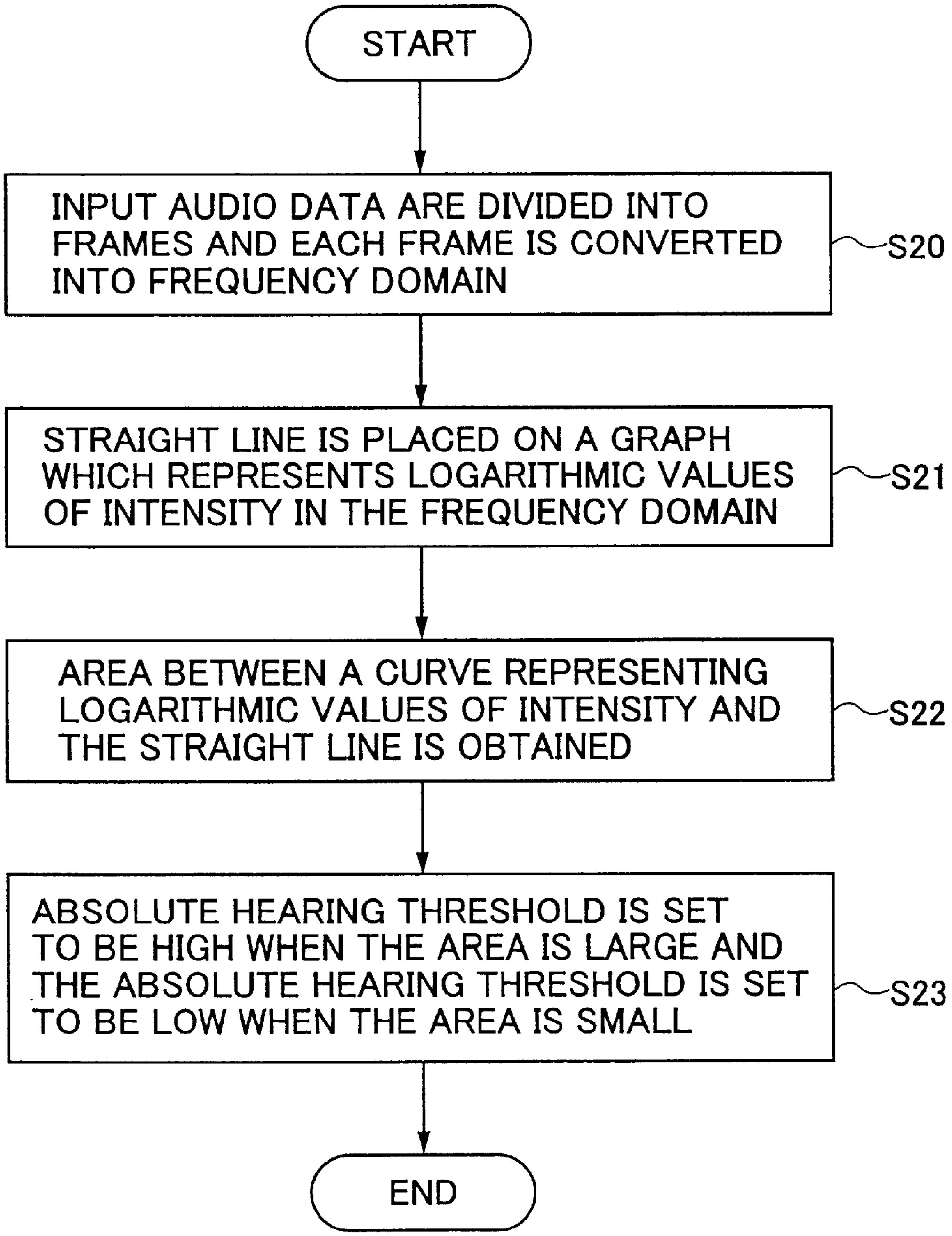
FIG. 10 is a flowchart showing basic processes of a digital audio coding method according to a first embodiment.

A first embodiment of the present invention will be described in the following. A digital audio coding apparatus of the first embodiment can be configured as shown in FIG. 2. FIG. 10 is a flowchart showing basic processes of a digital audio coding method according to the first embodiment. These processes are performed in the psychoacoustic model part 1 in FIG. 2.

First, input audio data in the time domain are divided into frames and each frame is converted into values in the frequency domain in step 20. Next, a straight line is placed on a graph which represents logarithmic values of intensity in the frequency domain in step 21. Then, an area between a curve representing logarithmic values of intensity and the straight line is obtained in step 22. The absolute hearing threshold is set to be high when the area is large and the absolute hearing threshold is set to be low when the area is small in step 23.

When the straight line is placed in step 21, the inclination and the range in the frequency domain are predetermined, and the initial point varies according to input data. More precisely, in the curve representing logarithmic values of intensity, the maximum value among predetermined first several points which are in the lowest frequency side in the frequency range where the area is calculated is set as a value for the lowest frequency of the straight line in the frequency range.

Figure 11:
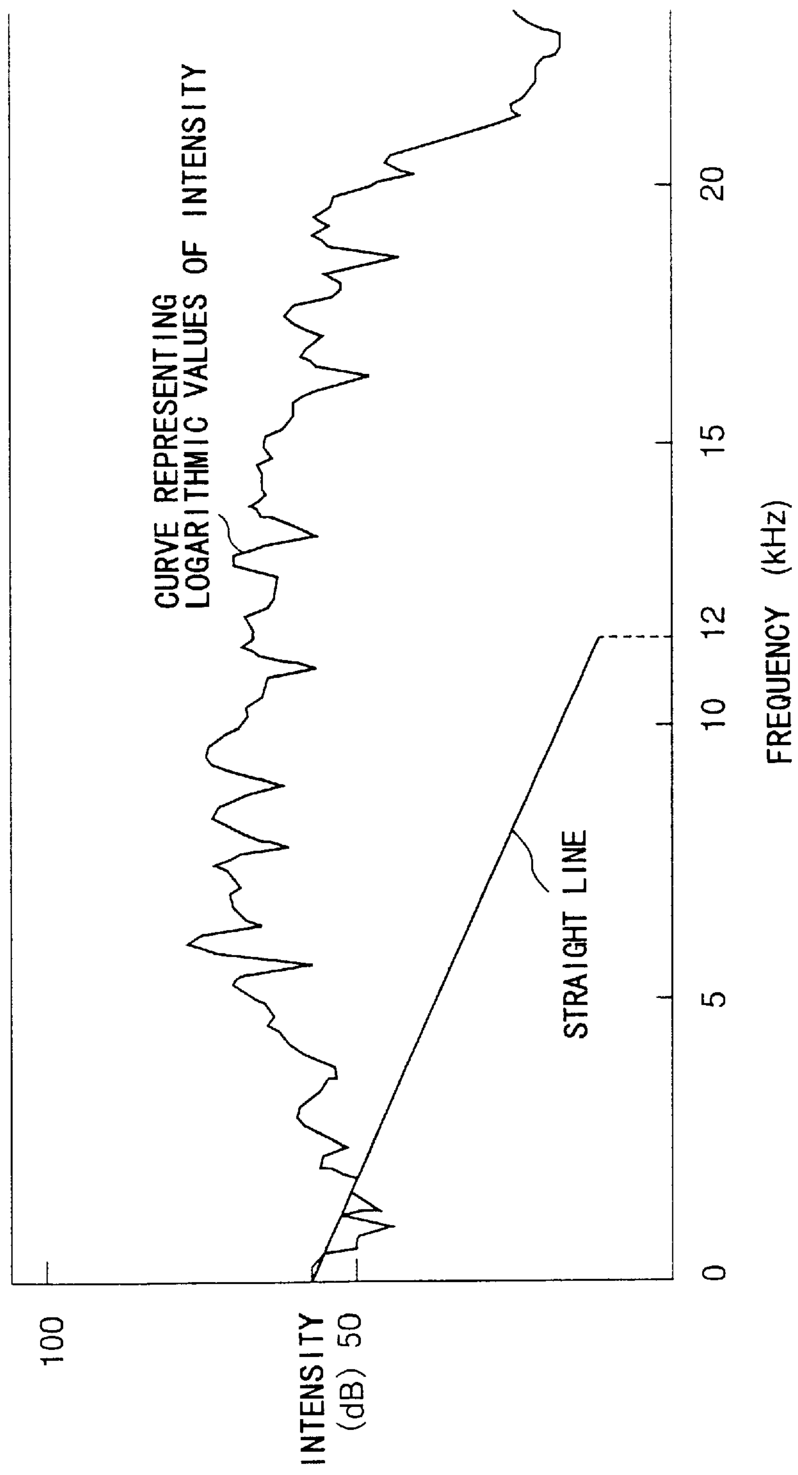
FIG. 11 shows an example in which a straight line is placed on a graph which represents logarithmic values of intensity in a frequency domain.

In the following, detailed description will be given by using examples. FIG. 11 shows an example in which input audio data is converted into the frequency domain and the straight line is placed on a graph which represents logarithmic values of intensity in the frequency domain.

Figure 12:
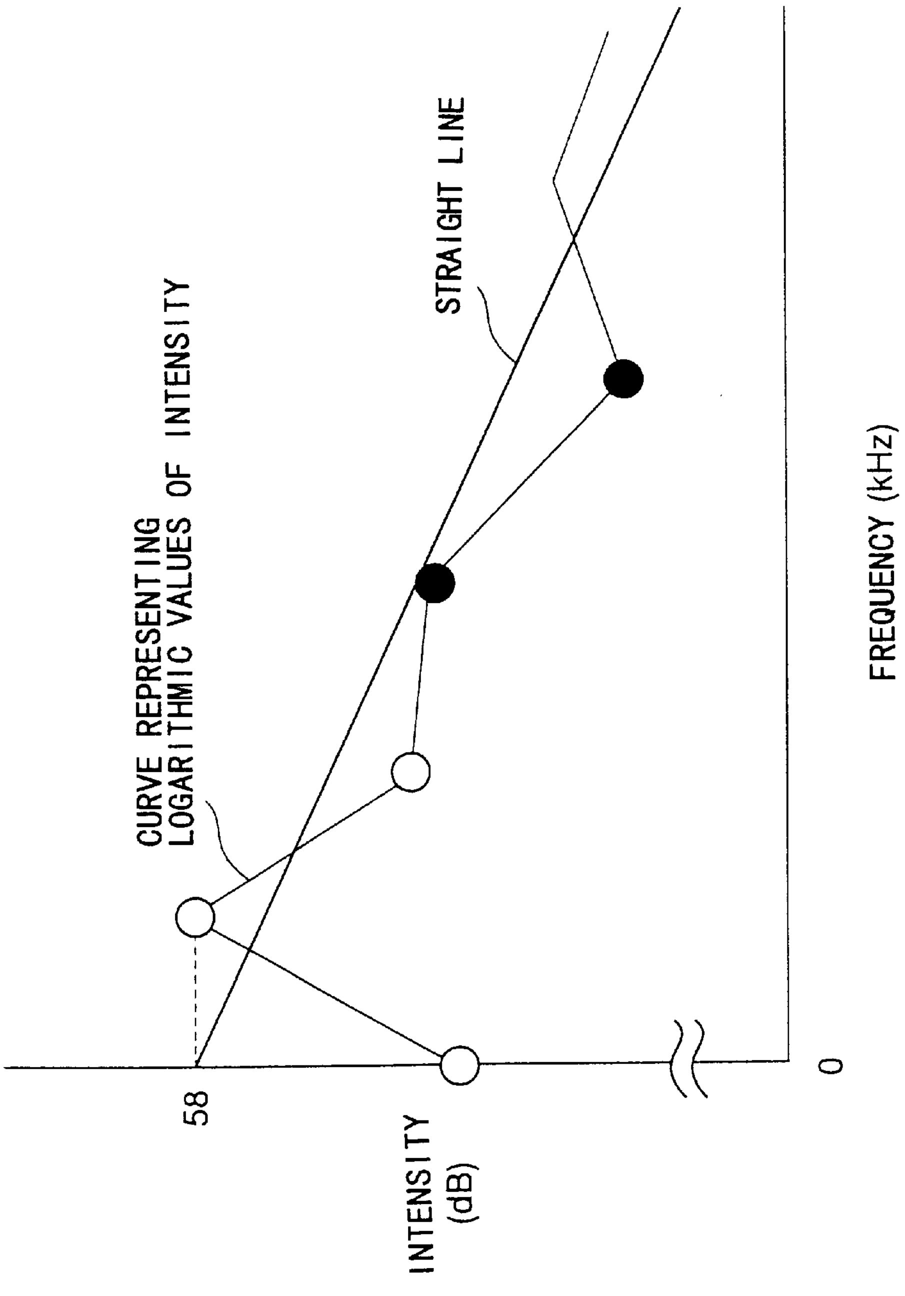
FIG. 12 is a figure for explaining a method of determining an initial point of the straight line.

The inclination of the straight line is constant regardless of input data. In addition, the range of the straight line is predetermined (from 0 kHz to 12 kHz in this example as shown in FIG. 11). For example, assuming that first three points of the lowest frequency (0 kHz) side in the range from 0 kHz to 12 kHz are in positions as shown in FIG. 12. In this example, the second point takes the maximum value (58 dB) in the three points. Thus, the value of the straight line at 0 kHz is set to be the same as the value of the second point.

Figure 13:
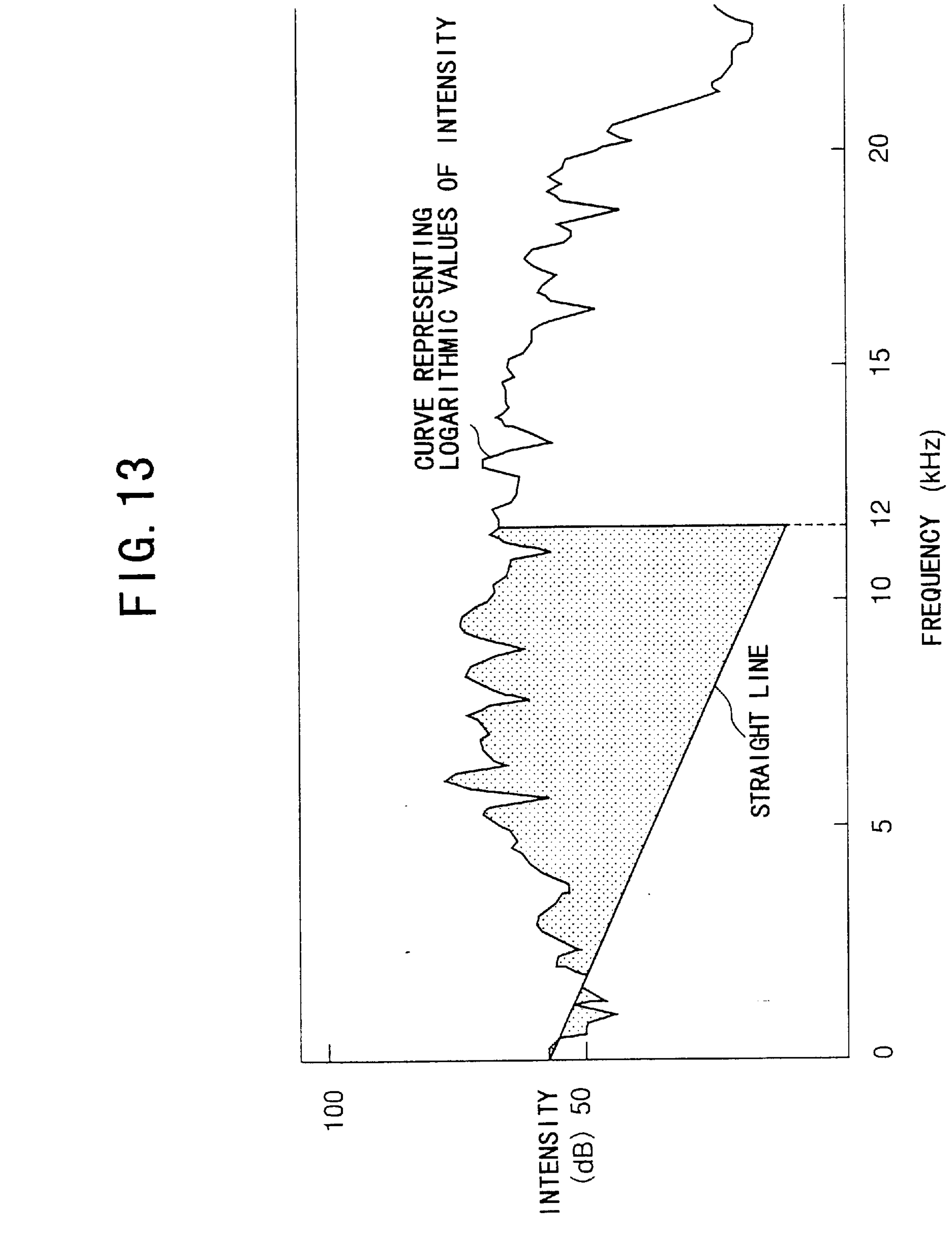
FIG. 13 shows a part between a curve representing logarithmic values of intensity and the straight line when the area of the part is large.

Next, in the range from 0 kHz to 12 kHz, the area between the curve representing logarithmic values of intensity and the straight line is calculated. FIG. 13 shows the area, which is filled in with gray, for the example of FIG. 11.

The area can be calculated, for example, by the following equation (3), $$S = \sum_{f_i \in F} |E(f_i) - L(f_i)| \tag{3}$$

wherein $E(f_i)$ indicates the logarithmic value of intensity in a frequency $f_i$, $L(f_i)$ indicates the value of the straight line and F indicates the frequency range where the area is calculated.

Figure 14:
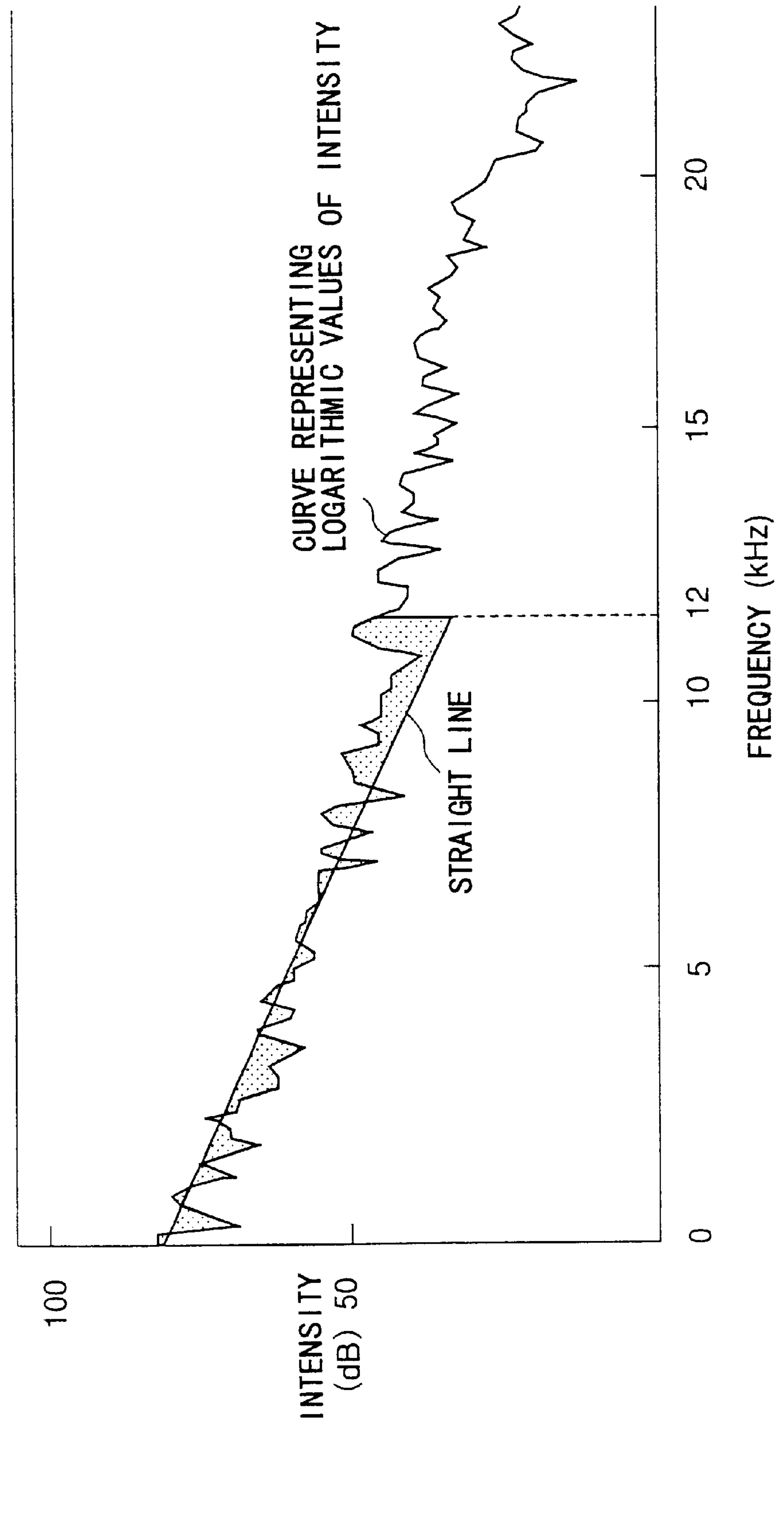
FIG. 14 shows a part between a curve representing logarithmic values of intensity and the straight line when the area of the part is small.
Figure 15:
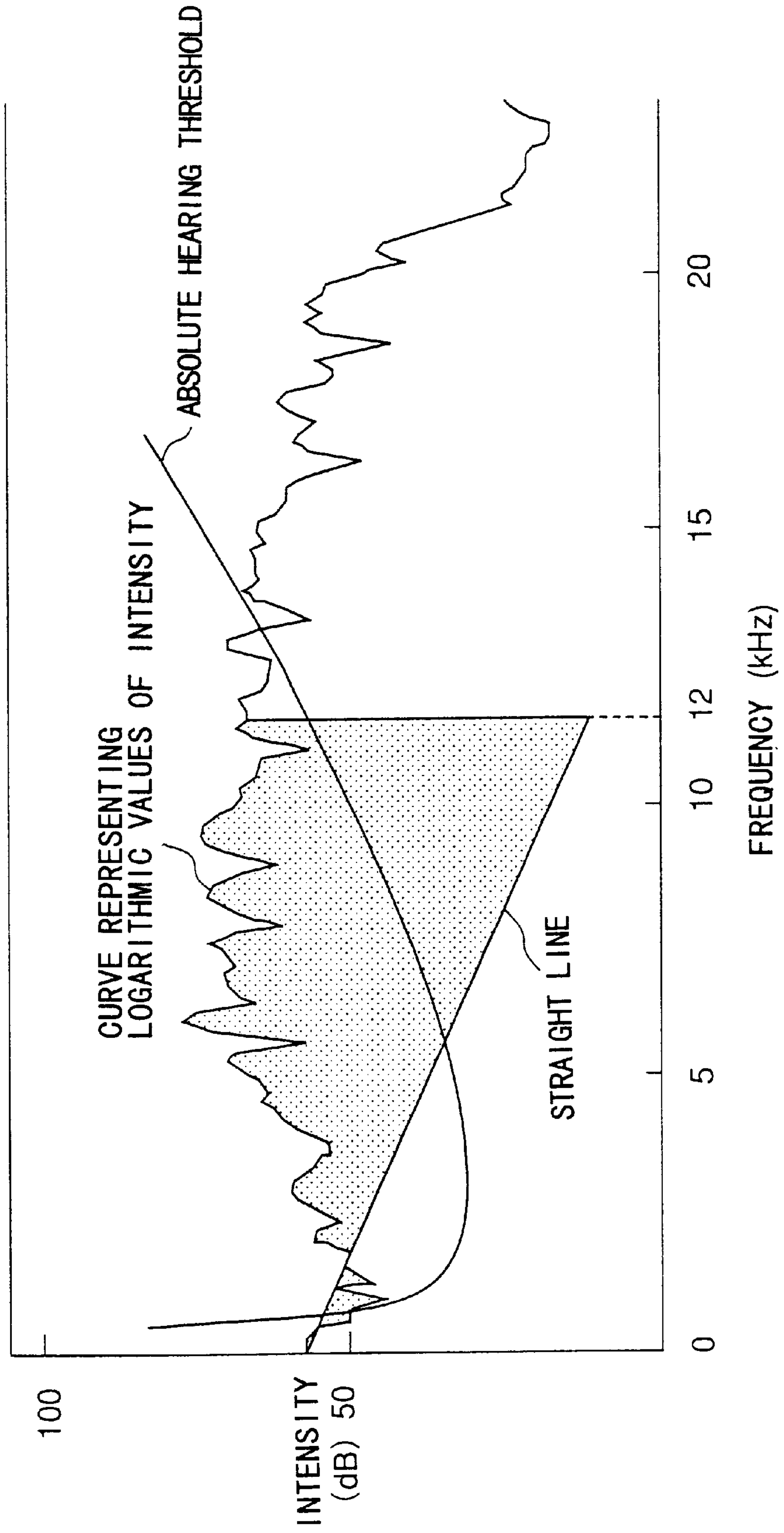
FIG. 15 shows an example in which the absolute hearing threshold is to be high.
Figure 16:
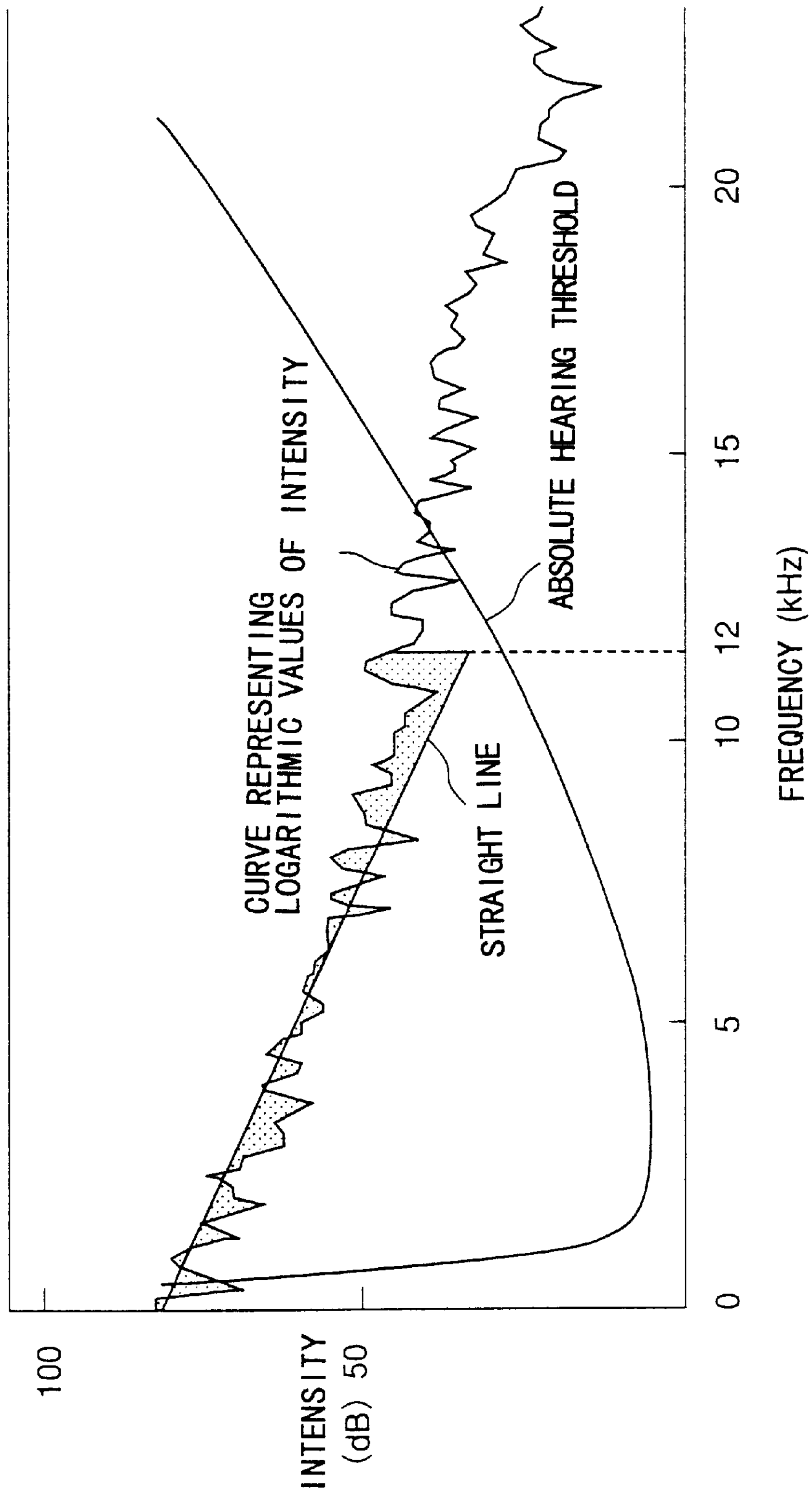
FIG. 16 shows an example in which the absolute hearing threshold is to be low.

FIG. 14 shows an example in which the above-mentioned process is performed for another input data. As is easily understood by comparing FIG. 13 and FIG. 14, the area shown in FIG. 13 is larger than that of FIG. 14. Thus, as shown in FIG. 15 and FIG. 16 respectively, the absolute hearing threshold is set to be high for input data shown in FIG. 13 and the absolute hearing threshold is set to be low for input data shown in FIG. 14.

The absolute hearing threshold can be set in the following way for example.

As shown in FIG. 17, when the area is equal to or more than 500 and smaller than 600, a value in the recommendation table is used for the absolute hearing threshold. When the area is equal to or more than 600 and smaller than 700, a value in which 10 dB is added to the value in the recommendation table is used. When the area is more than 700, a value in which 20 dB is added to the value in the recommendation table is used. When the area is equal to or more than 400 and smaller than 500, a value in which 10 dB is subtracted from the value in the recommendation table is used. When the area is smaller than 400, a value in which 20 dB is subtracted from the value in the recommendation table is used.

The above-mentioned method is an example, and other methods can be used as long as, according to the methods, when the curve representing logarithmic values of intensity of the audio signal is near to the straight line, the absolute hearing threshold is set to be low, and when the curve is not near to the straight line, the absolute hearing threshold is set to be high.

By using the absolute hearing threshold which is set according to the above-mentioned way, the process in step 11 in the ISO/IEC13838-7 can be performed for example.

The inclination of the straight line is not limited to that shown in the figures and the range is not limited to from 0 kHz to 12 kHz. In addition, the number of points which are referred to when the value of the straight line at the lowest frequency is determined is not limited to three. These are constant regardless of input data. In addition, the equation used for calculation of the area is not limited to the equation (3). Further, the setting method of the absolute hearing threshold is not limited to the method shown in FIG. 17 as long as when the area between the curve and the line is relatively large, the absolute hearing threshold is set to be high, and when the area between the curve and the line is relatively small, the absolute hearing threshold is set to be low.

As mentioned above, input audio data in the time domain are converted into values in the frequency domain, a straight line is placed on a graph which represents logarithmic values of intensity in the frequency domain, and an area between a curve representing logarithmic values of intensity and the straight line is obtained. Then, the absolute hearing threshold is set to be high when the area is large, and the absolute hearing threshold is set to be low when the area is small.

In addition, when the straight line is placed, the inclination and the range in the frequency domain are predetermined, and, in the curve representing logarithmic values of intensity, the maximum value among predetermined first several points which are in the lowest frequency side in the frequency range where the area is calculated is set as a value of the straight line corresponding to the lowest frequency in the frequency range.

Accordingly, the absolute hearing threshold can be set according to the input audio signal, thereby the allowed distortion level can be calculated properly and bit assignment can be performed properly so that coded sound quality improves.

The above-mentioned method can be applied not only to AAC but also to other audio compression coding systems which use the absolute hearing threshold.

In the following, a technique will be described as an second embodiment in which the method of the first embodiment is applied to an audio compression coding method which uses the long block and the short block described in the related art.

(Second Embodiment)

Figure 18:
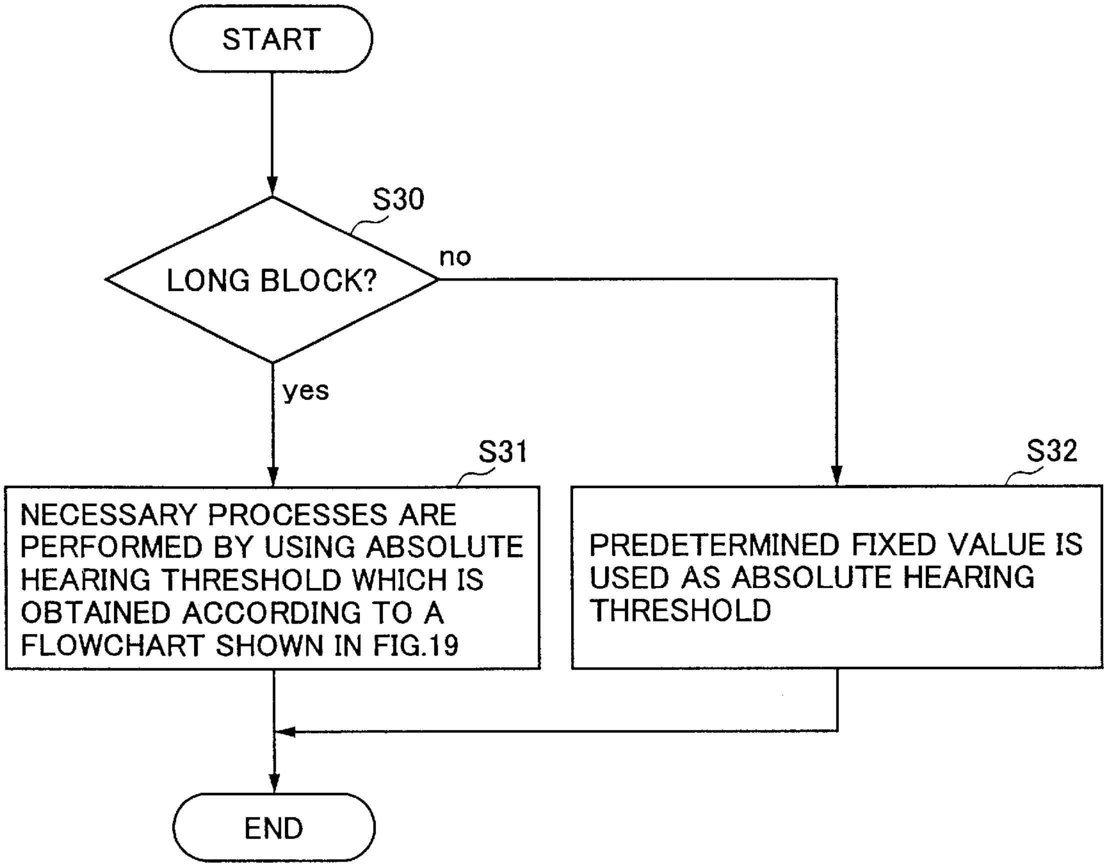
FIG. 18 is a flowchart showing basic processes of a digital audio coding method according to a second embodiment.
Figure 19:
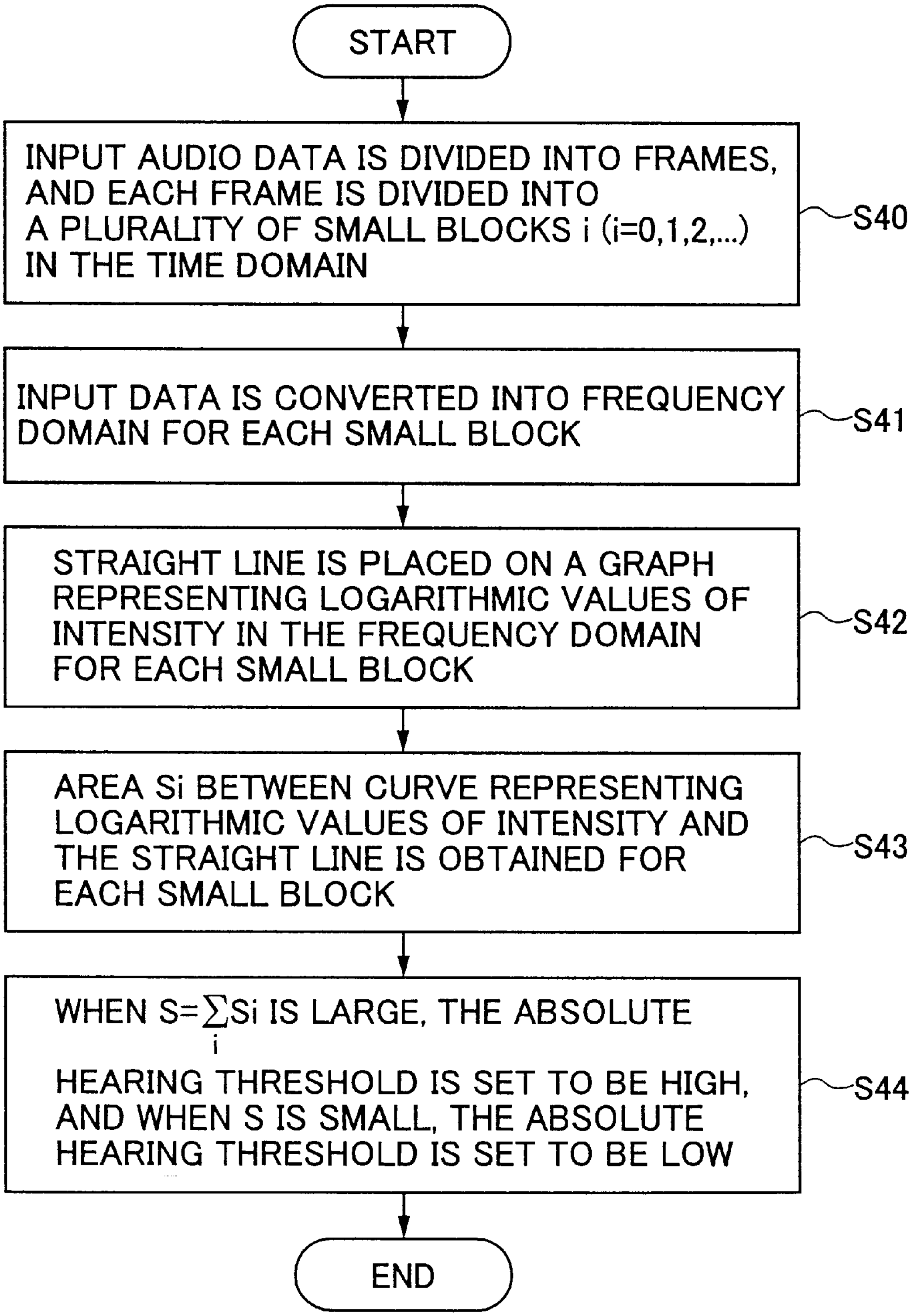
FIG. 19 is a flowchart showing basic processes of a digital audio coding method according to the second embodiment.

FIGS. 18 and 19 are flowcharts showing basic processes according to the second embodiment.

In the calculation method of the allowed distortion level and the judging method between the long block and the short block for each divided band described in the related art, the absolute hearing threshold is used in step 11 and the judgment of long/short is performed in step 13. Thus, it is necessary to consider both cases where a frame is converted by the long block or the frame is converted by the short block in step 11. That is, the absolute hearing threshold should be set for each of the long and short blocks.

In this embodiment, after the judgment is performed in step 13, if it is judged that the frame is to be converted by the long block in step 30 in FIG. 18, necessary processes are performed in step 31 by using the absolute hearing threshold which is obtained according to a flowchart shown in FIG. 19.

When it is judged that the frame is converted by the short frame, a predetermined fixed value is used as the absolute hearing threshold in step 32.

In the following, the processes for setting the absolute hearing threshold when the frame is converted by the long frame will be described with reference to the flowchart in FIG. 19.

Figure 20:
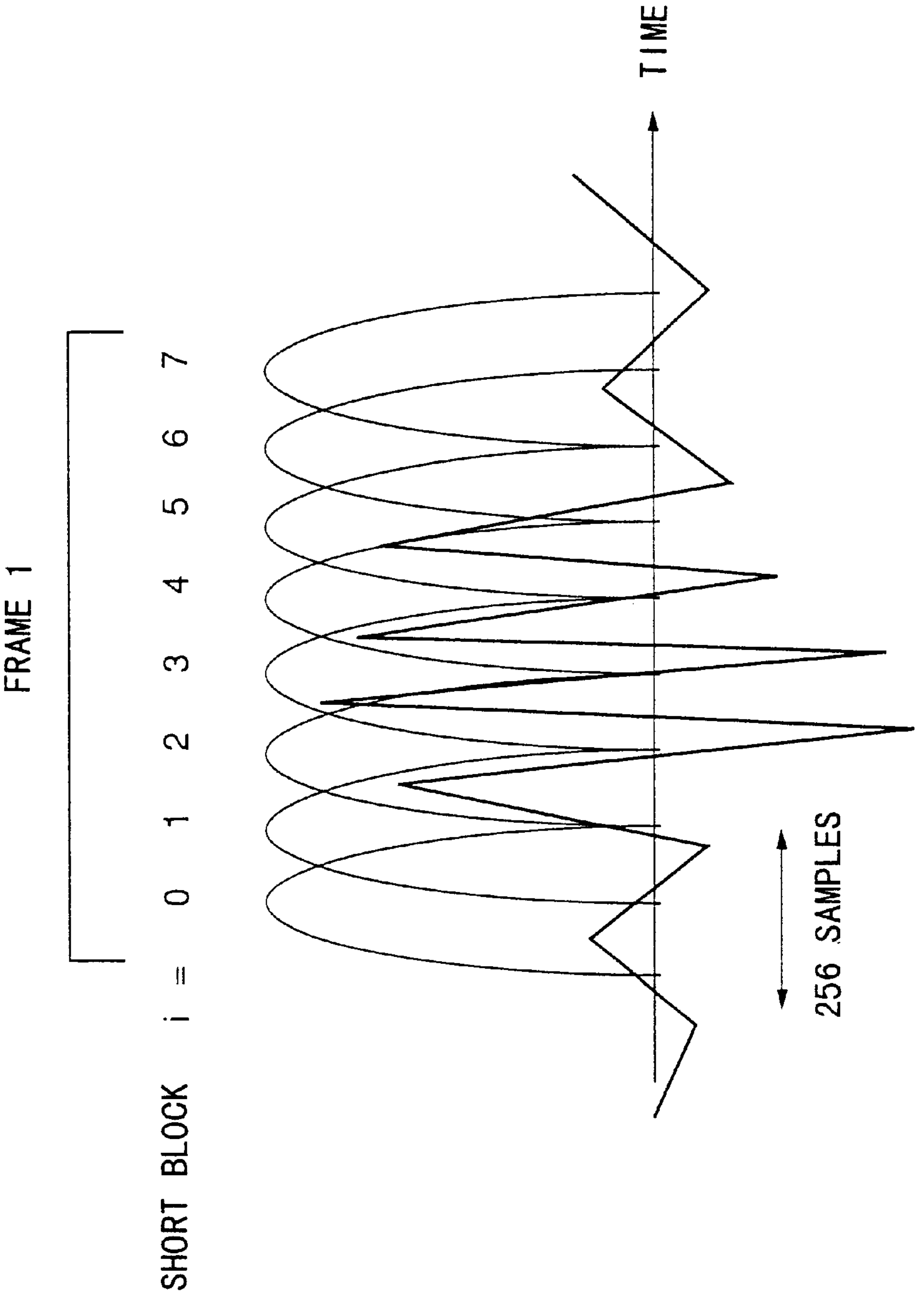
FIG. 20 shows an example in which the frame of the input audio data in the time domain is divided into successive eight short blocks i (i=0,1,2, . . . )

First, a frame of input audio data in the time domain is divided into a plurality of small blocks in step 40. More precisely, the frame is divided into small blocks defined in ISO/IEC13818-7, that is, eight short blocks each having 256 samples as shown in FIG. 20. FIG. 20 shows an example in which the frame of the input audio data in the time domain is divided into successive eight short blocks i (i=0,1,2, . . . ). The division method is not limited to that in the ISO/IEC13818-7. For example, the frame may be divided into four short blocks where each short block has 512 samples. However, processes become simpler when the short block defined in the ISO/IEC13818-7 is used.

Next, input data is converted into values in the frequency domain for each divided small block in step 41. Next, a straight line is placed on a graph representing logarithmic values of intensity in the frequency domain in step 42. Then, an area Si between the curve representing logarithmic values of intensity and the straight line is obtained in step 43. Then, a sum S of Si of all small blocks in the frame is obtained. When S is large, the absolute hearing threshold is set to be high, and when S is small, the absolute hearing threshold is set to be low in step 44. The absolute hearing threshold set in this step is an absolute hearing threshold for the whole frame not for each small block since the absolute hearing threshold is a value for converting a frame by the long block.

The straight line is placed and the area is obtained in the same way as the first embodiment. However, according to the second embodiment, the input audio data is divided into a plurality of small blocks and the area is obtained for each of the small blocks.

FIG. 21 shows $Si(0 \leqq i \leqq 7)$ calculated for the input audio data shown in FIG. 20. More precisely, FIG. 21 shows each area for each short block and the sum of the areas, that is, area $Si(0 \leqq i \leqq 7)$ for short block i and the sum S of the areas Si. The sum S of Si can be calculated by the following equation (4).

$$S = \sum_i S_i \tag{4}$$

The absolute hearing threshold can be set in the following way for example.

As shown in FIG. 22, when the sum S of areas is equal to or more than 500 and smaller than 600, a value in the recommendation table is used for the absolute hearing threshold. When the sum S of areas is equal to or more than 600 and smaller than 700, a value in which 10 dB is added to the value in the recommendation table is used. When the sum S of areas is more than 700, a value in which 20 dB is added to the value in the recommendation table is used. When the sum S of areas is equal to or more than 400 and smaller than 500, a value in which 10 dB is subtracted from the value in the recommendation table is used. When the sum S of areas is smaller than 400, a value in which 20 dB is subtracted from the value in the recommendation table is used.

By using the absolute hearing threshold which is set according to the above-mentioned way, the process in step 11 in the ISO/IEC13838-7 can be performed for example.

The inclination of the straight line and the way for calculating the area are not limited to those of the first embodiment. In addition, the method for setting the absolute hearing threshold is not limited to the example shown in FIG. 22, as long as, when the area between the curve and the line is relatively large, the absolute hearing threshold is set to be high, and, when the area between the curve and the line is relatively small, the absolute hearing threshold is set to be low.

The configuration of the digital audio coding apparatus is not limited to the example shown in FIG. 2. The digital audio coding apparatus can be realized by a computer in which programs which cause the computer to perform processes of the present invention are installed. The programs can be recorded in a recording medium such as a floppy disc, a memory card, CD-ROM and the like from which the programs can be installed in a computer which performs digital audio coding.

Figure 23:
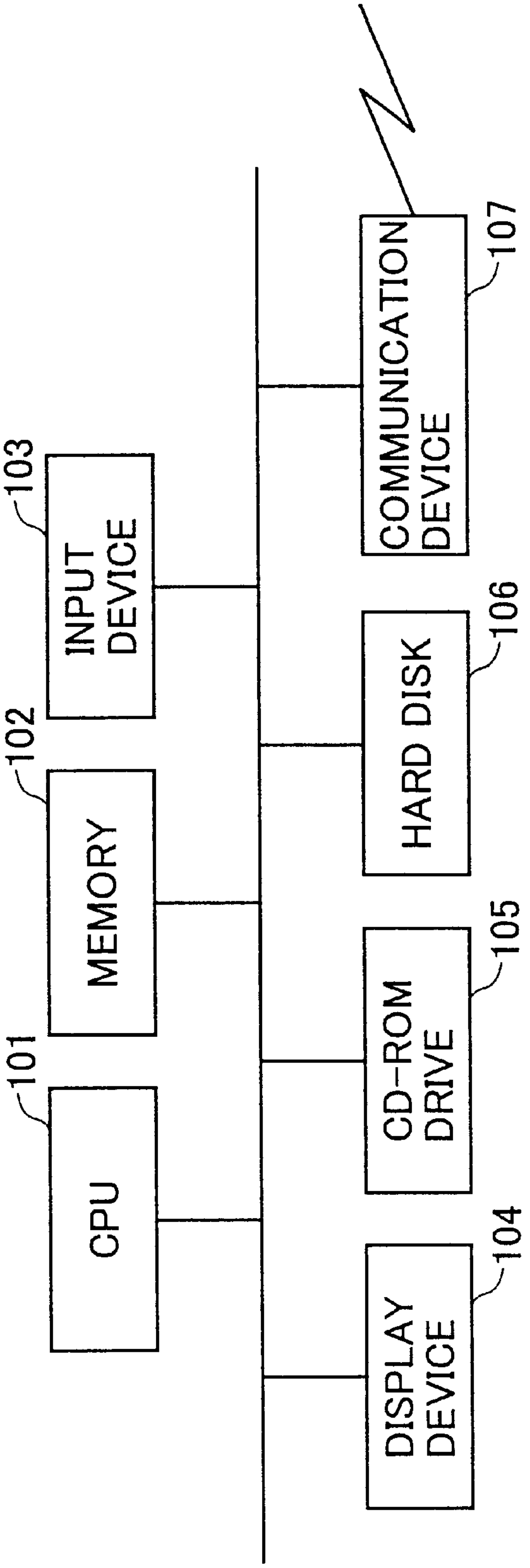
FIG. 23 shows a configuration example of a computer which can be used as the digital audio coding apparatus.

FIG. 23 shows a configuration example of the computer which can be used as the digital audio coding apparatus. The computer includes a CPU (central processing unit) 101, a memory 102, an input device 103, a display device 104, a CD-ROM drive 105, a hard disk 106 and a communication device 107. The memory 102 stores data and a program used for the CPU 101. The input device 103 is a device for inputting audio signal. The display device 104 is a display and the like. The CD-ROM drive 105 drives a CD-ROM and the like and performs read/write. The hard disk 106 stores programs and data necessary for performing processes of the present invention. The communication device 107 is for performing data transmission and reception via a network.

The program for realizing the present invention may be preinstalled in the computer, or stored in a CD-ROM for example and loaded in the hard disk 106 via the CD-ROM drive 105. When the program is launched, a predetermined program part is stored in the memory 102 and processes are performed. For example, data obtained by compressing audio signal is output to the hard disk 106. In addition, the data can be sent to another computer via the communication device 107.

According to the present invention, framed input audio data in the time domain are divided into a plurality of small blocks and converted into values in the frequency domain for each small block, a straight line is placed on a graph which represents logarithmic values of intensity in the frequency domain, and an area between a curve representing logarithmic values of intensity and the straight line is obtained.

In addition, the inclination and the range in the frequency domain are predetermined, and, in the curve representing logarithmic values of intensity, the maximum value among predetermined first several points which are in the lowest frequency side in the frequency range where the area is calculated is set as a value for the lowest frequency in the frequency range of the straight line. Then, the absolute hearing threshold is set to be high when the sum of areas of all small blocks in a frame is large, and the absolute hearing threshold is set to be low when the sum is small.

Accordingly, for a frame in which variation of intensity is large, the area can be calculated according to the variation. Thus, sound quality can be improved.

In addition, in the method where framed input audio data is converted by a long block or converted by a plurality of short blocks, when the long block is used, the data is divided into small blocks as described in the second embodiment, then, the absolute hearing threshold is set by the above-mentioned method. When the short block is used, a predetermined fixed absolute hearing threshold is used. Therefore, since the absolute hearing threshold can be set considering which is used between the long block and the short block, the sound quality can be further improved.

The present invention is not limited to the specifically disclosed embodiments, and variations and modifications may be made without departing from the scope of the invention.

What is claimed is:

1. A digital audio coding apparatus comprising:

a part which converts a frame of digital audio data into a frequency domain;

a part which divides said digital audio data into a plurality of bands;

a part which calculates an allowed distortion level by using an absolute hearing threshold for each divided band and assigns coding bits;

a change part which changes said absolute hearing threshold adaptively on the basis of intensity distribution of said digital audio data in the frequency domain.

2. The digital audio coding apparatus as claimed in claim 1, wherein said change part changes said absolute hearing threshold on the basis of logarithmic values of intensity of said digital audio data for each frame in the frequency domain.

3. The digital audio coding apparatus as claimed in claim 1, wherein a straight line is placed on a graph representing logarithmic values of intensity of said digital audio data in the frequency domain and said absolute hearing threshold is set according to an area of a part between a curve representing said logarithmic values of intensity and said straight line.

4. The digital audio coding apparatus as claimed in claim 3, wherein said change part sets said absolute hearing threshold to be high when said area of said part between said curve representing said logarithmic values of intensity and said straight line is larger than a predetermined value, and sets said absolute hearing threshold to be low when said area is smaller than said predetermined value.

5. The digital audio coding apparatus as claimed in claim 4, wherein an inclination of said straight line and a frequency range over which said area is calculated are predetermined, and an initial point of said straight line is set according to input digital audio data.

6. The digital audio coding apparatus as claimed in claim 5, wherein a maximum value among initial several points in said curve on a low frequency side in a frequency range over which said area is calculated is set to be a value of said straight line for the lowest frequency in said frequency range.

7. The digital audio coding apparatus as claimed in claim 3, wherein said change part divides said frame into a plurality of small blocks and calculates said area for each of said small blocks.

8. The digital audio coding apparatus as claimed in claim 7, wherein said change part calculates a sum of areas of said small blocks, and sets said absolute hearing threshold to be high when said sum is larger than a predetermined value, and sets said absolute hearing threshold to be low when said sum is smaller than said predetermined value.

9. A digital audio coding apparatus comprising:

a part which divides input digital audio data into frames along a time axis;

a part which performs processes including sub-band division and conversion into a frequency domain on each frame;

a part which divides said digital audio data into a plurality of bands and assigns coding bits to each band;

a part which obtains normalized coefficients according to the number of coding bits and encodes said digital audio data by quantizing with said normalized coefficients;

a change part which changes an absolute hearing threshold adaptively on the basis of intensity distribution of said digital audio data in the frequency domain; and a part which calculates an allowed distortion level for each band by using said absolute hearing threshold and assigns said coding bits by using said allowed distortion level.

10. A digital audio coding apparatus comprising:

a part which divides digital audio data into frames;

a part which converts each frame of said digital audio data to a frequency domain by using a long transform block or a plurality of short transform blocks;

a part which divides said frame of said digital audio data in the frequency domain into a plurality of bands;

a part which calculates an allowed distortion level by using an absolute hearing threshold for each divided band and assigns coding bits; wherein:

when said long transform block is used for conversion, said frame is divided into a plurality of small blocks and each of said small blocks are converted to the frequency domain;

for each of said small blocks, a straight line is placed on a graph representing logarithmic values of intensity of said digital audio data in the frequency domain and an area of a part between a curve representing said logarithmic values of intensity and said straight line is calculated;

a sum of said areas of said small blocks are calculated, and, said absolute hearing threshold is set to be high when said sum is larger than a predetermined value, and said absolute hearing threshold is set to be low when said sum is smaller than said predetermined value; and when said short transform blocks are used for conversion, a predetermined fixed absolute hearing threshold is used.

11. A digital audio coding method comprising the steps of:

dividing input digital audio data into frames along a time axis;

performing processes including sub-band division and conversion into a frequency domain on each frame;

dividing said digital audio data into a plurality of bands and assigns coding bits to each band;

obtaining normalized coefficients according to the number of coding bits and encoding said digital audio data by quantizing with said normalized coefficients;

wherein an absolute hearing threshold is changed adaptively on the basis of intensity distribution of said digital audio data in the frequency domain; and an allowed distortion level are calculated for each band by using said absolute hearing threshold and said coding bits are assigned by using said allowed distortion level.

12. The digital audio coding method as claimed in claim 11, wherein a straight line is placed on a graph representing logarithmic values of intensity of said digital audio data in the frequency domain, and said absolute hearing threshold is set according to an area of a part between a curve representing said logarithmic values of intensity and said straight line.

13. The digital audio coding method as claimed in claim 12, wherein said absolute hearing threshold is set to be high when said area of said part between said curve representing said logarithmic values of intensity and said straight line is larger than a predetermined value, and said absolute hearing threshold is set to be low when said area is smaller than said predetermined value.

14. A digital audio coding method comprising the steps of:

dividing digital audio data into frames;

converting each frame of said digital audio data to a frequency domain by using a long transform block or a plurality of short transform blocks;

dividing said frame of said digital audio data in the frequency domain into a plurality of bands;

calculating an allowed distortion level by using an absolute hearing threshold for each divided band and assigns coding bits; wherein:

when said long transform block is used for conversion, said frame is divided into a plurality of small blocks and each of said small blocks are converted to the frequency domain;

for each of said small blocks, a straight line is placed on a graph representing logarithmic values of intensity of said digital audio data in the frequency domain, and an area of a part between a curve representing said logarithmic values of intensity and said straight line is calculated;

a sum of said areas of said small blocks are calculated, and, said absolute hearing threshold is set to be high when said sum is larger than a predetermined value, and said absolute hearing threshold is set to be low when said sum is smaller than said predetermined value; and when said short transform blocks are used for conversion, a predetermined fixed absolute hearing threshold is used.

15. A computer readable medium storing program code for causing a computer to perform digital audio coding, said computer readable medium comprising:

program code means for dividing input digital audio data into frames along a time axis;

program code means for performing processes including sub-band division and conversion into a frequency domain on each frame;

program code means for dividing said digital audio data into a plurality of bands and assigns coding bits to each band;

program code means for obtaining normalized coefficients according to the number of coding bits and encoding said digital audio data by quantizing with said normalized coefficients;

wherein an absolute hearing threshold is changed adaptively on the basis of intensity distribution of said digital audio data in the frequency domain; and an allowed distortion level are calculated for each band by using said absolute hearing threshold and said coding bits are assigned by using said allowed distortion level.

16. The computer readable medium as claimed in claim 15, wherein a straight line is placed on a graph representing logarithmic values of intensity of said digital audio data in the frequency domain, and said absolute hearing threshold is set according to an area of a part between a curve representing said logarithmic values of intensity and said straight line.

17. The computer readable medium as claimed in claim 16, wherein said absolute hearing threshold is set to be high when said area of said part between said curve representing said logarithmic values of intensity and said straight line is larger than a predetermined value, and said absolute hearing threshold is set to be low when said area is smaller than said predetermined value.

18. A computer readable medium storing program code for causing a computer to perform digital audio coding, said computer readable medium comprising:

program code means for dividing digital audio data into frames;

program code means for converting each frame of said digital audio data to a frequency domain by using a long transform block or a plurality of short transform blocks;

program code means for dividing said frame of said digital audio data in the frequency domain into a plurality of bands;

program code means for calculating an allowed distortion level by using an absolute hearing threshold for each divided band and assigns coding bits, wherein:

when said long transform block is used for conversion, said frame is divided into a plurality of small blocks and each of said small blocks are converted to the frequency domain;

for each of said small blocks, a straight line is placed on a graph representing logarithmic values of intensity of said digital audio data in the frequency domain, and an area of a part between a curve representing said logarithmic values of intensity and said straight line is calculated;

a sum of said areas of said small blocks are calculated, and, said absolute hearing threshold is set to be high when said sum is larger than a predetermined value, and said absolute hearing threshold is set to be low when said sum is smaller than said predetermined value; and when said short transform blocks are used for conversion, a predetermined fixed absolute hearing threshold is used.

* * * * *